(12) United States Patent
Kato

(10) Patent No.: US 7,082,077 B2
(45) Date of Patent: Jul. 25, 2006

(54) CONTROL METHOD OF SEMICONDUCTOR MEMORY DEVICE AND SEMICONDUCTOR MEMORY DEVICE

(75) Inventor: Kenta Kato, Kasugai (JP)

(73) Assignee: Spansion LLC, Sunnyvale, CA (US)

( * ) Notice: Subject to any disclaimer, the term of this patent is extended or adjusted under 35 U.S.C. 154(b) by 516 days.

(21) Appl. No.: 10/635,431

(22) Filed: Aug. 7, 2003

(65) Prior Publication Data

US 2004/0027903 A1 Feb. 12, 2004

(30) Foreign Application Priority Data

Aug. 8, 2002 (JP) ............................. 2002-231825

(51) Int. Cl.
*G11C 8/00* (2006.01)

(52) U.S. Cl. ..................... 365/233; 365/233.5
(58) Field of Classification Search ............... 365/233, 365/233.5, 189.01
See application file for complete search history.

(56) References Cited

U.S. PATENT DOCUMENTS 4,875,189 A * 10/1989 Obara .................... 365/189.04
5,555,215 A * 9/1996 Nakagome et al. ......... 365/226
6,600,688 B1 * 7/2003 Kawabata ................... 365/205

* cited by examiner

*Primary Examiner*—Vu A. Le

(57) ABSTRACT

A control method of a semiconductor memory device which enables control of an operation mode including an operation that might become a noise source by using an operation mode including an operation from which the influence of noise should be eliminated, and a semiconductor memory device are provided. First and second operation sections performing independent operations are provided, and a signal output section for outputting a second signal S2 and a mode controller section for supplying a control signal C1 are provided in the second operation section. The control signal C1 is outputted from the mode controller section and the signal output section outputs the second signal S2 to a memory cell array, thus performing a second operation. A predetermined first signal SS1 is supplied to the signal output section from the first operation section, thus delaying an output response of a predetermined second signal. While the control signal C1 is outputted from the mode controller section, the supply of the predetermined second signal to the memory cell array can be delayed. The influence of state transition in the second operation on the operation state of the first operation can be eliminated.

32 Claims, 18 Drawing Sheets

FIRST PRINCIPLE OF PRESENT INVENTION

FIRST PRINCIPLE OF PRESENT INVENTION

SECOND PRINCIPLE OF PRESENT INVENTION

THIRD PRINCIPLE OF PRESENT INVENTION

FIG. 4 CIRCUIT BLOCK DIAGRAM OF SEMICONDUCTOR MEMORY DIRECTED TO FIRST EMBODIMENT

FIG. 5 CIRCUIT DIAGRAM OF FIRST SPECIFIC EXAMPLE DIRECTED TO FIRST EMBODIMENT

OPERATIONAL WAVEFORM OF FIRST SPECIFIC EXAMPLE
DIRECTED TO FIRST EMBODIMENT

FIG. 7 CIRCUIT DIAGRAM OF SECOND SPECIFIC EXAMPLE DIRECTED TO FIRST EMBODIMENT

OPERATIONAL WAVEFORM OF SECOND SPECIFIC
EXAMPLE DIRECTED TO FIRST EMBODIMENT

FIG. 9 CIRCUIT BLOCK DIAGRAM OF SEMICONDUCTOR MEMORY DIRECTED TO SECOND EMBODIMENT

CIRCUIT DIAGRAM OF SPECIFIC EXAMPLE DIRECTED TO SECOND EMBODIMENT

OPERATIONAL WAVEFORM OF SPECIFIC EXAMPLE DIRECTED TO SECOND EMBODIMENT

CIRCUIT BLOCK DIAGRAM OF SEMICONDUCTOR MEMORY DIRECTED TO THIRD EMBODIMENT

MODE CONTROL SECTION IN SEMICONDUCTOR MEMORY DIRECTED TO FOURTH EMBODIMENT

CIRCUIT DIAGRAM OF FIRST SPECIFIC EXAMPLE DIRECTED TO FOURTH EMBODIMENT

OPERATIONAL WAVEFORM OF FIRST SPECIFIC EXAMPLE DIRECTED TO FOURTH EMBODIMENT

CIRCUIT BLOCK DIAGRAM OF SECOND SPECIFIC EXAMPLE DIRECTED TO FOURTH EMBODIMENT

OPERATIONAL WAVEFORM OF SECOND EXAMPLE DIRECTED TO FOURTH EMBODIMENT

CIRCUIT DIAGRAM OF THIRD SPECIFIC EXAMPLE DIRECTED TO FOURTH EMBODIMENT

STATE MACHINE IN SEMICONDUCTOR MEMORY DIRECTED TO FIFTH EMBODIMENT

CIRCUIT BLOCK DIAGRAM OF CONVENTIONAL SEMICONDUCTOR MEMORY

OPERATIONAL WAVEFORM OF RESPECTIVE FUNCTION MODES
(READ OPERATION)

(PGM OPERATION)

(ER OPERATION)

CONTROL METHOD OF SEMICONDUCTOR MEMORY DEVICE AND SEMICONDUCTOR MEMORY DEVICE

CROSS-REFERENCE TO RELATED APPLICATIONS

This application is based upon and claims the benefit of priority from each of the prior Japanese Patent Application No. 2002-231825 filed on Aug. 8, 2002, the entire contents of which are incorporated herein by reference.

BACKGROUND OF THE INVENTION

1. Field of the Invention

This invention relates to a control method of a semiconductor memory device having a plurality of operation modes and a semiconductor memory device, and particularly to a control method of a semiconductor memory device which enables performing suitable individual operation controls when the respective operations modes are independently executed, and a semiconductor memory device.

2. Description of Related Art

FIG. 20 is a circuit block diagram showing a semiconductor memory having a memory cell array divided into a plurality of banks B0 to BN. Here, a non-volatile semiconductor memory such as a flash memory is described as an exemplary semiconductor memory.

In the non-volatile semiconductor memory having the multi-bank structure shown in FIG. 20, write switch circuits 1010 to 101N and read switch circuits 1040 to 104N are provided for the banks B0 to BN, respectively. Each of the switch circuits is independently selected corresponding to the banks B0 to BN, thus enabling setting of an operation mode for each bank. The operation modes include a data readout (hereinafter simply referred to as READ) operation mode and a data write (hereinafter simply referred to as WRITE) operation mode, and the WRITE mode included a program (hereinafter simply referred to as PGM) operation mode and a data erase (hereinafter simply referred to as ER) operation mode, as will be later described with reference to FIGS. 21A to 21C.

When the WRITE mode is set, one of the write switch circuits (one of 1010 to 101N) is selected and therefore a necessary bias voltage VX corresponding to the PGM/ER mode is supplied to a selected bank (one of B0 to BN) via the write switch circuit. The bias voltage VX is generated at a voltage generator circuit 106. The voltage to be generated is a voltage between a normal bias voltage from a ground voltage VSS to a power source voltage VCC used in the data readout operation such as the READ operation and a high bias voltage such as a negative voltage lower than the ground voltage VSS or a positive voltage higher than the power source voltage VCC. In accordance with an enable signal EX of a predetermined bias voltage VX outputted from a write control circuit 105, the voltage generator circuit 106 starts the operation to generate the bias voltage VX. Enable signals EnX (E0X to ENX) similarly outputted from the write control circuit 105 are inputted to the write switch circuits 1010 to 101N, respectively, to control opening and closing of the write switch circuits 1010 to 101N.

When the READ mode is set, one of the read switch circuits (one of 1040 to 104N) is selected and therefore a data current is read out from a selected bank (one of B0 to BN) via the read switch circuit. The read-out data current is differentially amplified at a sense amplifier 108 with a reference current outputted from a reference cell 109. The differential amplification is carried out after the current is converted to a voltage value, if necessary. The sense amplifier 108 is controlled by a read control signal RDC outputted from a read control circuit 107.

In FIG. 20, the write control circuit 105, the voltage generator circuit 106, the read control circuit 107 and the sense amplifier 108 are provided as one set in the semiconductor memory. On the other hand, the write switch circuits 1010 to 101N and the read switch circuits 1040 to 104N for selecting banks as objects of operation are provided for the respective banks. This enables the READ mode and the WRITE mode to operate at independent timing for different banks.

As described above, the READ operation and the WRITE operation separately operate at independent timing for the respective banks. Moreover, the respective operations themselves are intrinsic, as shown in FIGS. 21A to 21C.

As shown in FIG. 21A, in the READ operation, a readout operation is carried out by reading data stored in the memory cell as a data current and differentially amplifying the data current with a reference current. Specifically, when transition of address ADD is detected by the read control circuit 107 (FIG. 20), a high pulse is outputted as an address transition detector signal ATD. At the same time, a data path via the read switch circuit and a reference current path from the reference cell 109 are set up and a data current Idata and a reference current Iref start to flow. Following the high pulse of the address transition detector signal ATD, an equalize signal EQ shifts to a high level to initialize the sense amplifier 108. During this time, the data current Idata and the reference current Iref shift to a predetermined current level. At a point when the predetermined current level is reached, the equalize signal EQ shifts to a low level while a sense amplifier activation signal LT becomes a high pulse. During this high-pulse period, the sense amplifier 108 performs the differential amplification operation. Generally, the differential amplification operation is carried out after the data current Idata and the reference current Iref are converted to voltages. The above-described READ operation enables reduction in access time by the proper arrangement in the circuit structure and thus enables operation with an access time of nanoseconds (nsec).

On the other hand, the WRITE operation such as the PGM operation shown in FIG. 21B and the ER operation shown in FIG. 21C is carried out by a change in physical status, that is, the presence/absence of electrons at a floating gate of the memory cell. Physical phenomena of passage of electrons through a gate oxide film are necessary such as injection of electrons using hot electrons and emission of electrons using FN tunneling. To generate such physical phenomena decided by physical elements such as process technology and device structure, a high electric field due to application of a high voltage difference is necessary.

Specifically, during a PGM period following a program verification (hereinafter simply referred to as PGMV) period, positive voltages are applied to a word line WL, which is a control gate terminal of the memory cell, and a bit line BL, which is a drain terminal (for example, 9 V to the word line WL and 5 V to the bit line BL). During an ER period following an erase verification (hereinafter simply referred to as ERV) period, a negative voltage is applied to the word line WL and a positive voltage is applied to a well WELL, which is a back gate constituting a channel region (for example −9 V to the word line WL and 9 V to the well WELL).

As the PGM/ER period, for example, an access time of microsecond (○sec) is necessary. While transition of threshold voltage of the memory cell is confirmed during the PGMV/ERV period, the similar operation is repeated until the threshold voltage of the memory cell reaches a predetermined threshold voltage. To complete the PGM/ER operation, for example, an access time of millisecond (msec) is necessary.

However, in the conventional semiconductor memory, in the READ operation, the data current Idata and the reference current Iref are converted to a data voltage Vdata and a reference voltage Vref, respectively, and a small amplitude voltage difference is differentially amplified in an access time of nanosecond (nsec). On the other hand, in the WRITE operation, a high bias voltage is repeatedly applied in a cycle of microsecond (○sec) within a time of millisecond (msec) until the completion of the operation. Moreover, the READ operation and the WRITE operation separately operate at independent timing. Therefore, voltage transition between a normal bias voltage from the ground voltage VSS to the power source voltage VCC used in the READ operation and a high bias voltage such as a negative voltage lower than the ground voltage VSS or a positive voltage higher than the power source voltage VCC may be a noise source to the data voltage Vdata and the reference voltage Vref. As a result of reduction in small amplitude voltage difference to be differentially amplified at the sense amplifier 108, the data may be inverted and differentially amplified, causing a problem that false data may be outputted.

When voltage transition of the bias voltage VX from a positive voltage to a normal bias voltage or from a normal bias voltage to a negative voltage occurs, if lowering voltage transition has capacitive coupling with a data voltage Vdata of data "0", the small amplitude voltage difference from the reference voltage Vref is reduced and the margin of differential amplification is reduced. If capacitive coupling with the reference voltage Vref occurs, the small amplitude voltage difference from a data voltage Vdata of data "1" is reduced, causing a problem that the margin of differential amplification is reduced.

When voltage transition of the bias voltage VX from a normal bias voltage to a positive voltage or from a negative voltage to a normal bias voltage occurs, if boosting voltage transition has capacitive coupling with a data voltage Vdata of data "1", the small amplitude voltage difference from the reference voltage Vref is reduced and the margin of differential amplification is reduced. If capacitive coupling with the reference voltage Vref occurs, the small amplitude voltage difference from a data voltage Vdata of data "0" is reduced, causing a problem that the margin of differential amplification is reduced.

Moreover, the case where voltage transition of the bias voltage VX changes a substrate bias voltage by capacitive coupling with the substrate of the semiconductor memory can also be considered. The properties such as threshold voltage of each transistor arranged on the substrate change and may adversely affect the differential amplification operation of the small amplitude voltage difference. This is a problem.

In the case where the write control circuit 105, the voltage generator circuit 106, the read control circuit 107, the sense amplifier 108 and the like are provided as one set in the semiconductor memory, as shown in FIG. 20, the relation of arrangement with the banks B0 to BN varies by each bank. It can be also considered that a voltage change of the bias voltage VX may have large influence due to the relation of arrangement. In the case where a change position of the substrate bias voltage due to voltage transition and the source of the substrate bias voltage are away from each other, there is a problem that the change in the substrate bias voltage and deviation of the substrate bias voltage on the substrate may be left for a long time.

SUMMARY OF THE INVENTION

The present invention has been made to solve the above-mentioned problems. It is an object of the present invention to provide a control method of a semiconductor memory device and a semiconductor memory device capable of controlling operation modes that have noise source caused by the operation modes by operation to eliminate influence of noise, wherein the semiconductor memory device has a plurality of operation modes executed independently to one another.

To achieve the object, according to one aspect of the present invention, there is provided a control method of a semiconductor memory device comprising the steps of: first operation step executed in accordance with first operation sequence; second operation step executed in accordance with second operation sequence separately from the first operation step; and control step for delaying predetermined state transition to be executed in the second operation step following an instruction of the second operation sequence in accordance with predetermined first operation state in the first operation sequence.

In the control method of a semiconductor memory device according one aspect of the present invention, the first operation step is executed in accordance with the first operation sequence and the second operation step is executed in accordance with the second operation sequence separately from the first operation step. In case execution of the first operation step and that of the second operation step overlap, in the control step, execution of predetermined state transition in the second operation step is delayed based on predetermined first operation state in the first operation sequence.

Furthermore, there is provided a semiconductor memory device, directed to the one aspect of the present invention, comprising: a first circuit that outputs at least one first signal for first operation in accordance with first operation sequence; and a second circuit that outputs at least one second signal for second operation executed separately from the fist operation in accordance with second operation sequence, wherein the second circuit is controlled by at least one predetermined first signal out of the at least one first signal, and an output of at least one predetermined second signal out of the at least one second signal is delayed.

In the semiconductor memory device directed to the one aspect of the present invention, the first circuit and the second circuit operated separately from each other output at least one first signal and at least one second signal for executing first operation and second operation, respectively. In case the first operation and the second operation overlap, at least one predetermined second signal out of second signals is delayed based on at least one predetermined first signal out of first signals.

Thereby, even though the first operation step and the second operation step or the first operation and the second operation, executed separately from each other, overlap at arbitrary timing, predetermined state transition in the second operation step or execution of the second operation in accordance with at least one predetermined second signal outputted from the second circuit can be delayed. Predetermined operation state in the first operation step or execution of first operation in accordance with at least one predetermined first signal outputted from the first circuit is never executed in concurrence with the predetermined state transition in the second operation step or execution of second operation in accordance with at least one predetermined second signal. In case the first operation step and the second operation step or the first operation and the second operation are executed separately from each other, stable operation of both is secured without influence of predetermined state transition on predetermined operation state or influence of second operation in accordance with predetermined second signal on first operation in accordance with predetermined first signal.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

DETAILED DESCRIPTION OF THE PREFERRED EMBODIMENTS

Figure 1:
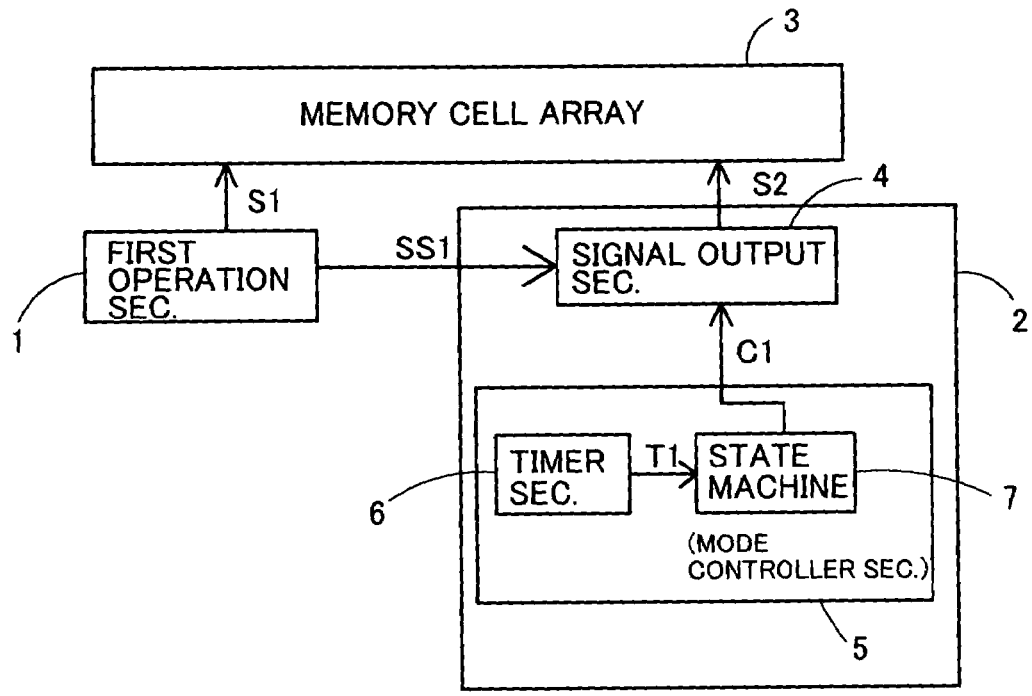
FIG. 1 is a first principle diagram.

FIG. 1 shows a first principle of the present invention. To carry out a first operation and a second operation to a memory cell array 3, a first operation section 1 and a second operation section 2 are provided. At least one first signal S1 and at least one second signal S2 are supplied to the memory cell array 3.

The second operation section 2 has a signal output section 4 for outputting the second signal S2 and a mode controller section 5 for supplying at least one control signal C1 for controlling the signal output section 4. The mode controller section 5 has a state machine 7 with a second operation sequence set therein, as a sequence control section, and also has a timer section 6 for supplying timer information T1 to the state machine 7. The control signal C1 is outputted from the state machine 7 in the mode controller section 5.

As the time is kept by the timer information T1 from the timer section 6, the control signal C1 is outputted on the basis of the second operation sequence set in the state machine 7. The control signal C1 is an instruction signal of state transition in the second operation. As the signal output section 4 that have received an instruction of state transition in accordance with the control signal C1 outputs the second signal S2 for the second operation to the memory cell array 3, the second operation is carried out.

According to the first principle, a predetermined first signal SS1 of the first signals is supplied to the signal output section 4 in the second operation section 2. On the basis of the input of the predetermined first signal SS1, output response of a predetermined second signal of the second signals S2 in the signal output section 4 can be delayed. While the control signal C1 from the mode controller section 5 is outputted in the second operation sequence set by the state machine 7, the supply of the predetermined second signal to the memory cell array 3 can be delayed. In this case, the predetermined first signal SS1 can be a signal indicating the operation status based on a small amplitude signal in the first operation. The predetermined second signal can be set as a signal that accompanies voltage transition or current transition in the second operation and may possibly become a noise source to the small amplitude signal operation in the first operation. Thus, when the first and second operations are independently carried out to the memory cell array 3, the influence of the state transition in the second operation on the operation status of the first operation can be eliminated and stable operations can be realized.

Although the predetermined first signal SS1 is described as a signal supplied to the second operation section 2 in the first principle shown in FIG. 1, the predetermined first signal SS1 may also be a signal supplied to the memory cell array 3 at the same time.

Figure 2:
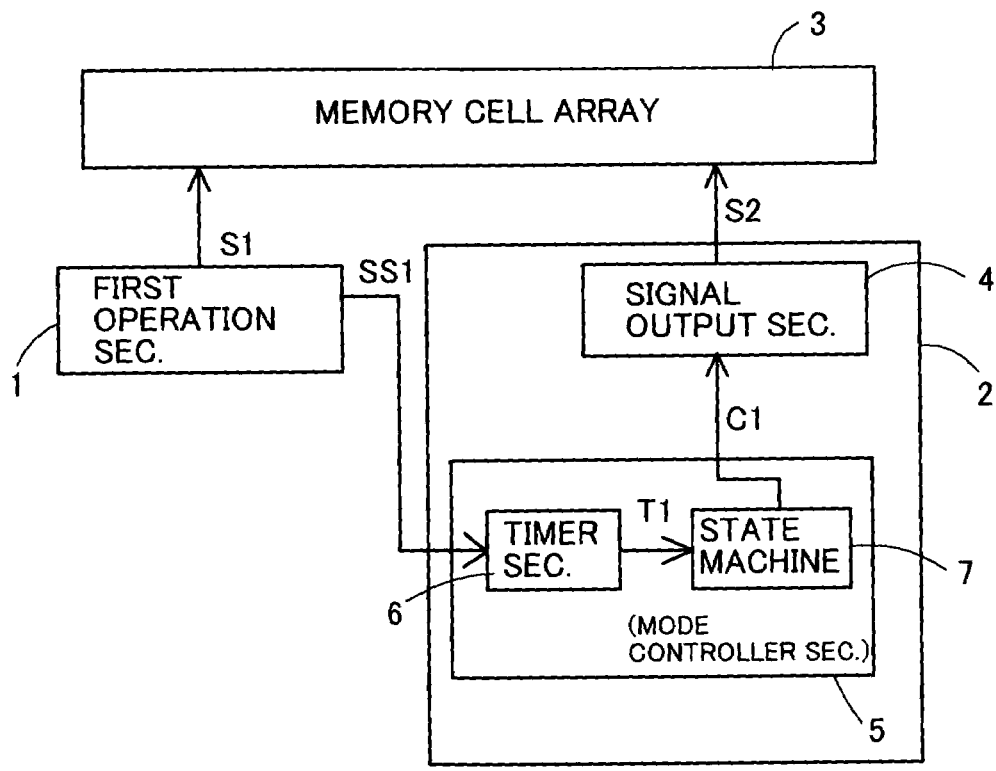
FIG. 2 is a second principle diagram.

FIG. 2 shows a second principle of the present invention. In this case, unlike the first principle of FIG. 1, the predetermined first signal SS1 is supplied to the timer section 6 of the mode controller section 5 in the second operation section 2. According to the second principle, the output timing of the timer information T1 outputted from the timer section 6 can be delayed on the basis of the input of the predetermined first signal SS1. As the time is kept by the timer information T1, output of the control signal C1 outputted from the state machine 7 is delayed because of the delayed supply of the timer information T1. In response to this delay, the second signal S2 for the second operation outputted from signal output section 4 can be delayed. Thus, when the first and second operations are independently carried out to the memory cell array 3, the influence of the state transition in the second operation on the operation status of the first operation can be eliminated and stable operations can be realized.

Figure 3:
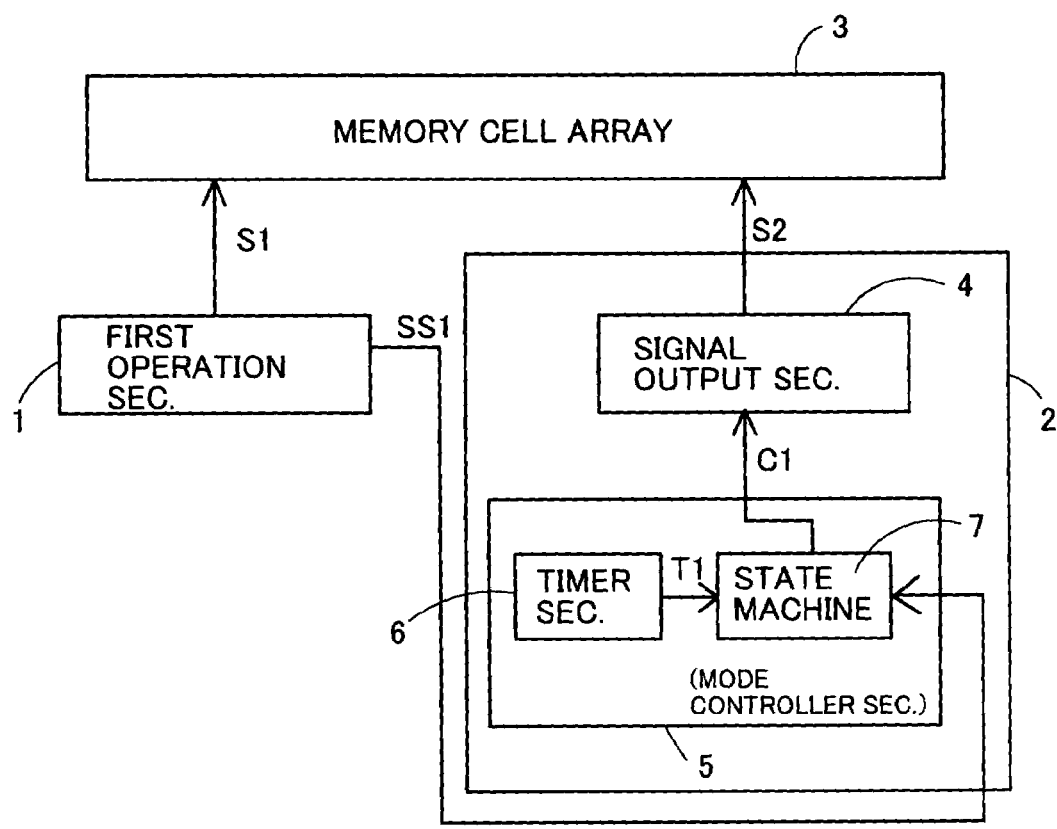
FIG. 3 is a third principle diagram.

FIG. 3 shows a third principle of the present invention. In this case, unlike the first principle of FIG. 1, the predetermined first signal SS1 is supplied to the state machine 7 of the mode controller section 5 in the second operation section 2. According to the third principle, a predetermined time during the state transition in the second operation sequence set in the state machine 7 can be extended on the basis of the input of the predetermined first signal SS1. As the predetermined time is extended, output of the control signal C1 outputted from the state machine 7 is delayed. In response to this delay, the second signal S2 for the second operation outputted from signal output section 4 can be delayed. Thus, when the first and second operations are independently carried out to the memory cell array 3, the influence of the state transition in the second operation on the operation status of the first operation can be eliminated and stable operations can be realized.

Hereinafter, embodiments of the control method of a semiconductor memory device and the semiconductor memory device according to the present invention will be described in detail with reference to FIGS. 4 to 19. In the following description, a non-volatile semiconductor memory is used as an example. The data readout operation is assumed to be the first operation, and the data write operation including the data program operation and the data erase operation is assumed to be the second operation.

Figure 4:
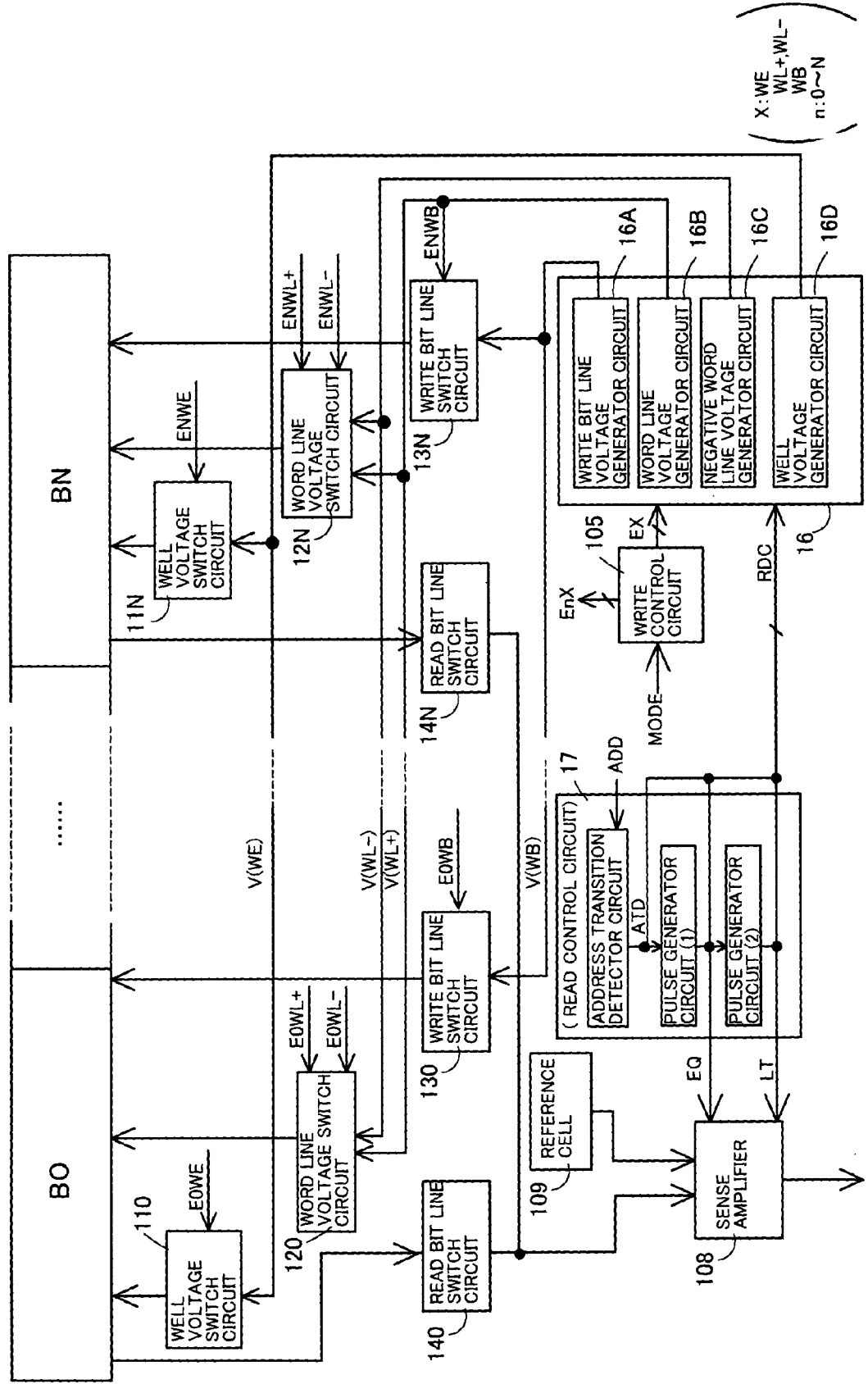
FIG. 4 is a circuit block diagram of a semiconductor memory directed to a first embodiment.

FIG. 4 shows a circuit block diagram of a semiconductor memory of a first embodiment. A memory cell array has a multi-bank structure divided into a plurality of banks B0 to BN. A bank is a predetermined unit of memory cell region in the memory cell array, in which the data readout operation and the data write operation are not exclusively controlled by each other and can be independently executed. Therefore, the data readout operation and the data write operation are carried out at arbitrary timing between banks.

From a read control circuit 17 to which an address ADD is inputted, various control signals ATD, EQ and LT are outputted. The address ADD is inputted to an address transition detector circuit, where transition of the address ADD is detected and an address transition detector signal ATD as a pulse signal is outputted. As the transition of the address ADD occurs, data readout control is started. The address transition detector signal ATD is inputted to a pulse generator circuit (1) in the read control circuit 17, where a sense amplifier equalize signal EQ with a predetermined pulse width is outputted to a sense amplifier 108. This is a signal for equalizing the sense amplifier 108 before new data readout. Moreover, the sense amplifier equalize signal EQ is inputted to a pulse generator circuit (2), where a sense amplifier latch signal LT with a predetermined pulse width is outputted to the sense amplifier 108, starting at the pulse end of the sense amplifier equalize signal EQ. This is a signal for amplifying and latching data read out from a bank, at the sense amplifier 108.

Data readout from a bank is carried out via read bit line switch circuits 140 to 14N provided for the banks B0 to BN, respectively, and provided between data read bit lines from the banks and the sense amplifier 108. As one of the read bit line switch circuits is selected in accordance with a selection signal, not shown, a data propagation path from the selected bank to the sense amplifier 108 is set up and its data is read out. In the non-volatile semiconductor memory, only a low voltage is applied to the read bit line because of the need to prevent disturbance in data readout. Therefore, a data current to be read out is very small and memory data in the case of being voltage-converted has a small amplitude voltage value.

Also reference data from a reference cell 109 is inputted to the sense amplifier 108. Differential amplification with the memory data inputted via the read bit line switch circuit is carried out and the data is read out. Similar to the memory data, the reference data has a small amplitude voltage, and also the voltage difference between these data is a small amplitude voltage.

That is, all of the memory data, the reference data, and the voltage difference between these data before differential amplification have small amplitude voltages and tend to be affected by peripheral noise.

To a write control circuit 105, in the data write operation, a mode signal MODE for setting whether the operation mode is the data program operation or the data erase operation is inputted. From the write control circuit 105, various enable signals EX, EnX (n=0 to N, which also applies to EnX in the following description) are outputted in accordance with the mode signal MODE.

The enable signal EX is inputted to a voltage generator circuit 16, thus enabling activation of one of various voltage generator circuits (one of 16A to 16D) in accordance with the mode signal MODE. Specifically, in the data program operation, the write bit line voltage generator circuit 16A and the word line voltage generator circuit 16B are set in an activation enable state in order to output a boosted write bit line voltage VWB and a boosted word line voltage VWL+. In the data erase operation, the negative word line voltage generator circuit 16C is set in an activation enable state in order to output a word line voltage VWL− which is a negative voltage, and the well voltage generator circuit 16D is set in an activation enable state in order to output a boosted well voltage VWE.

The enable signal EnX is inputted to various switch circuits 110 to 11N, 120 to 12N and 130 to 13N provided for the banks B0 to BN, respectively. As one of these switch circuits is selected, various biases necessary for the data write operation are supplied to each bank. Specifically, an output terminal V(WE) of the well voltage generator circuit 16D is connected to the well voltage switch circuits 110 to 11N, which are selected in accordance with enable signals E0WE to ENWE, respectively. Output terminals V(WL+) and V(WL−) of the word line voltage generator circuit 16B and the negative word line voltage generator circuit 16C are connected to the word line voltage switch circuits 120 to 12N, which are selected in accordance with enable signals E0WL+ to ENWL+ and E0WL− to ENWL−, respectively. Moreover, an output terminal V(WB) of the write bit line voltage generator circuit 16A is connected to the write bit line switch circuits 130 to 13N, which are selected in accordance with enable signals E0WB to ENWB, respectively.

As the enable signal EX corresponding to the mode signal MODE performs activation, one of the various voltage generator circuits (one of 16A to 16D) corresponding to whether the operation mode is the data program operation or the data erase operation is set in the activation enable state. At the same time, as the enable signal EnX corresponding to the mode signal MODE and a bank selection, not shown, performs activation, one of the switch circuits (one of 110 to 11N, 120 to 12N, and 130 to 13N) corresponding to the predetermined operation mode to the selected bank is selected and a bias supply path is set up.

Moreover, the various control signals ATD, EQ and LT (hereinafter generally referred to as read control signal RDC) outputted from the read control circuit 17 are inputted to the voltage generator circuit 16. The inputted read control signal RDC masks the enable signal EX. When the read control signal RDC is not activated, the voltage generator circuits 16A to 16D are activated in accordance with the enable signal EX outputted from the write control circuit 105 and various bias voltages VWB, VWL+, VWL− and VWE are outputted. When the read control signal RDC is activated, the enable signal EX is masked. The voltage generator circuits 16A to 16D are not activated and the various bias voltages VWB, VWL+, VWL− and VWE are not outputted.

The masking of the enable signal EX by the read control signal RDC is effective when it is carried out at the timing of voltage transition of the bias voltage in the data write operation. The timing of voltage transition is the timing when application of the bias voltage starts and the timing when application of the bias voltage ends. Therefore, it is preferred to mask at least one of the operation start time and the operation end time of the voltage generator circuits 16A to 16D. Thus, voltage transition of the bias voltage as in the data write operation does not occur at the timing of activation of the read control signal RDC when memory data of a small amplitude voltage is outputted in the data readout operation.

Figure 21A:
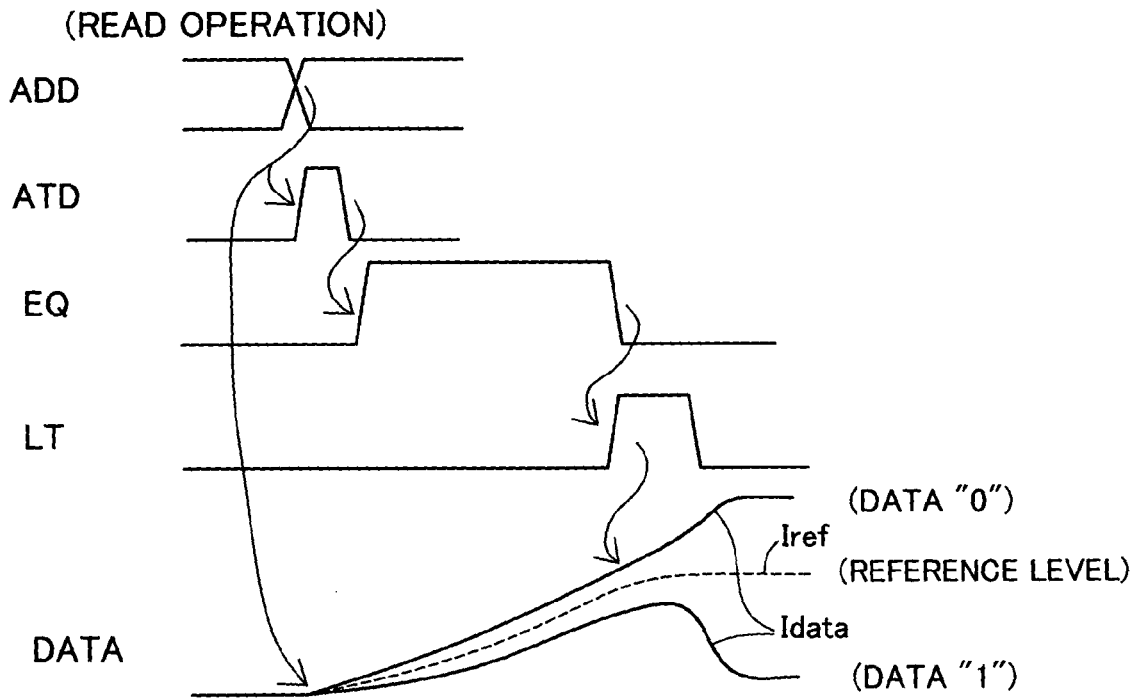
FIG. 21(A) shows an operational waveform diagram of READ operation.
Figure 21B:
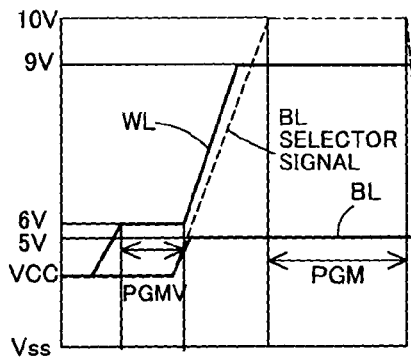
FIG. 21(B) shows an operational waveform diagram of PGM operation.
Figure 21C:
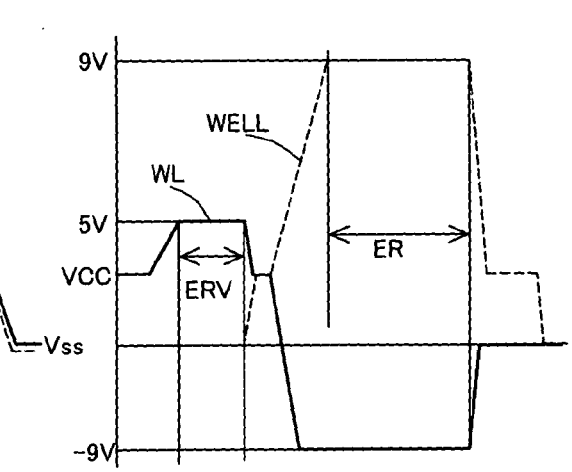
FIG. 21(C) shows an operational waveform diagram of ER operation.

The timing when application of the bias voltage starts and the timing when application of the bias voltage ends are at least one of the start of the data write operation, the end of the data writ operation, and the operation switching time in the write sequence, as shown in FIGS. 21A to 21C. This applies not only to the first embodiment but also to the other embodiments.

As the read control signal RDC, the various control signals ATD, EQ and LT can be individually used and can mask the voltage generator circuits 16A to 16D during this time. Moreover, the control signals ATD, EQ and LT can be suitably combined. Although not shown, as a circuit having a latch function is provided in the voltage generator circuit 16, false output of the various bias voltage VWB, VWL+, VWL− and VWE accompanied by signal transition between the control signals ATD, EQ and LT activated as pulse signals does not occur. This applies not only to the first embodiment but also to the other embodiment.

Figure 5:
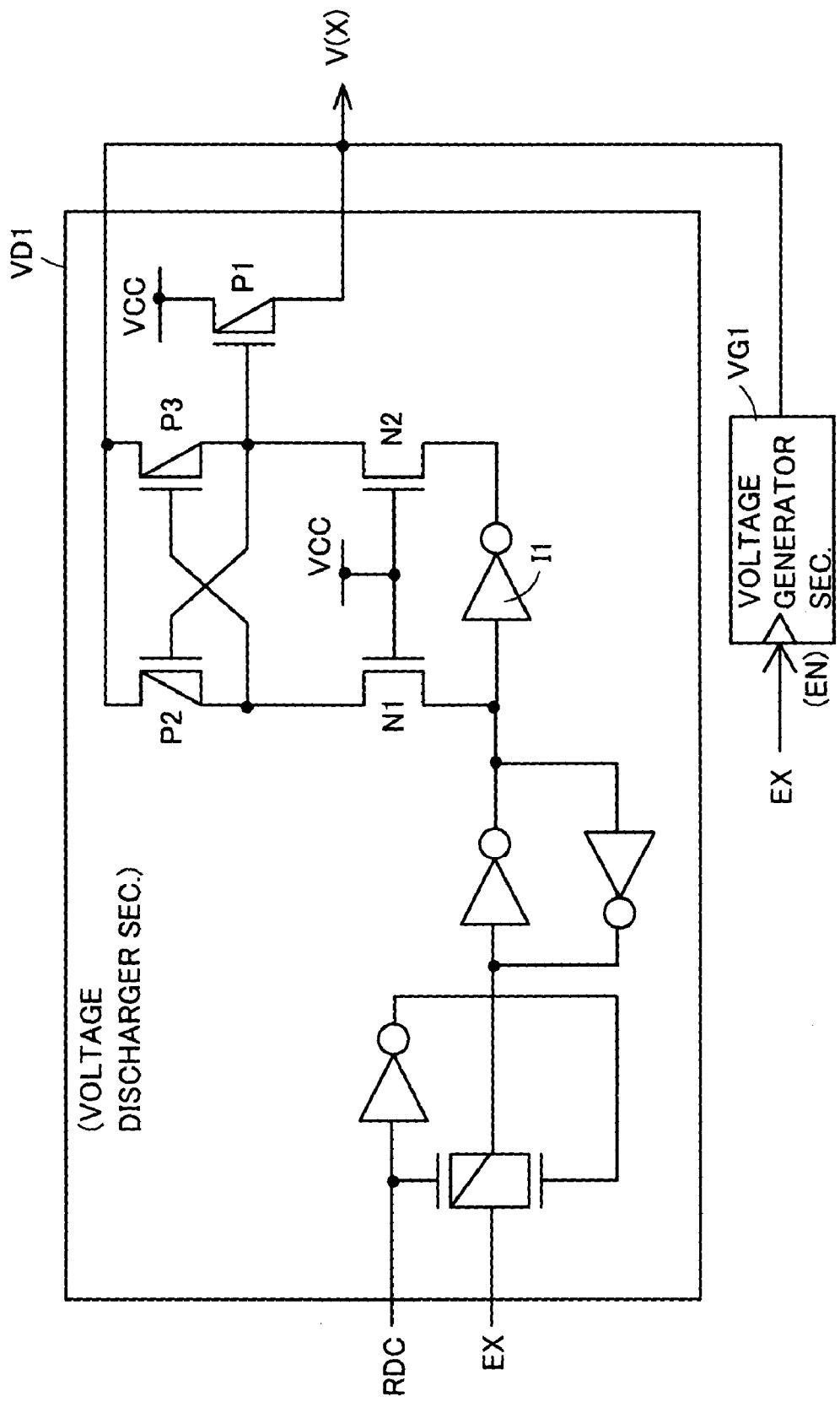
FIG. 5 is a circuit diagram of a first specific example directed to the first embodiment.

A first specific example of the first embodiment shown in FIG. 5 is an exemplary circuit structure for masking and delaying the timing of end of application of a bias voltage VX to a bias output terminal V(X) (X represents one of WB, WL+, WL− and WE, which also applies to X in the following description) with respect to the voltage generator circuits 16A to 16D.

The first specific example has a voltage generator section VG1 having the enable signal EX inputted to its enable terminal (EN), and a voltage discharger section VD1 controlled by the enable signal EX and the read control signal RDC. These sections are connected with each other at the bias output terminal V(X).

The voltage generator section VG1 outputs a boosting voltage VX to the bias voltage terminal V(X) in accordance with the enable signal EX to the enable terminal (EN).

In the voltage discharger section VD1, a PMOS transistor P1 for discharging the boosting voltage VX outputted to the bias voltage terminal V(X) to a power source voltage VCC is connected between the power source voltage VCC and the bias output terminal V(X). The gate terminal of the PMOS transistor P1 is connected to a connection point between the drain terminal of a PMOS transistor P3 and the drain terminal of an NMOS transistor N2. The PMOS transistor P3 and a PMOS transistor P2 have their respective source terminals connected to the bias voltage terminal V(X), and their gate terminals and drain terminals are cross-coupled. Moreover, the drain terminal of the PMOS transistor P2 is connected with the drain terminal of an NMOS transistor N1.

The gate terminals of the NMOS transistors N1 and N2 are biased to the power source voltage VCC in order to avoid application of the boosting voltage VX to the source terminal sides of the NMOS transistors N1 and N2 when the boosting voltage VX is applied to the drain terminals of the NMOS transistors N1 and N2. Between the source terminals, an inverter gate I1 is connected from the NMOS transistor N1 to the NMOS transistor N2. The output terminal of a latch circuit having two inverter gates, similar to a circuit structure which will be described later in a second specific example (FIG. 7), is connected to the input terminal of the inverter gate I1. The enable signal EX is latched to the latch circuit via a transfer gate. The enable signal EX to be latched is controlled by opening/closing of the transfer gate. The read control signal RDC is inputted directly to the gate terminal of the PMOS transistor and also inputted to the gate terminals of the NMOS transistor via the inverter gate. With the read control signal RDC at a low level, the logical level of the enable signal EX is taken in the latch circuit. The PMOS transistors P2, P3 and the NMOS transistors N1, N2 constitute a level converter circuit.

Figure 6:
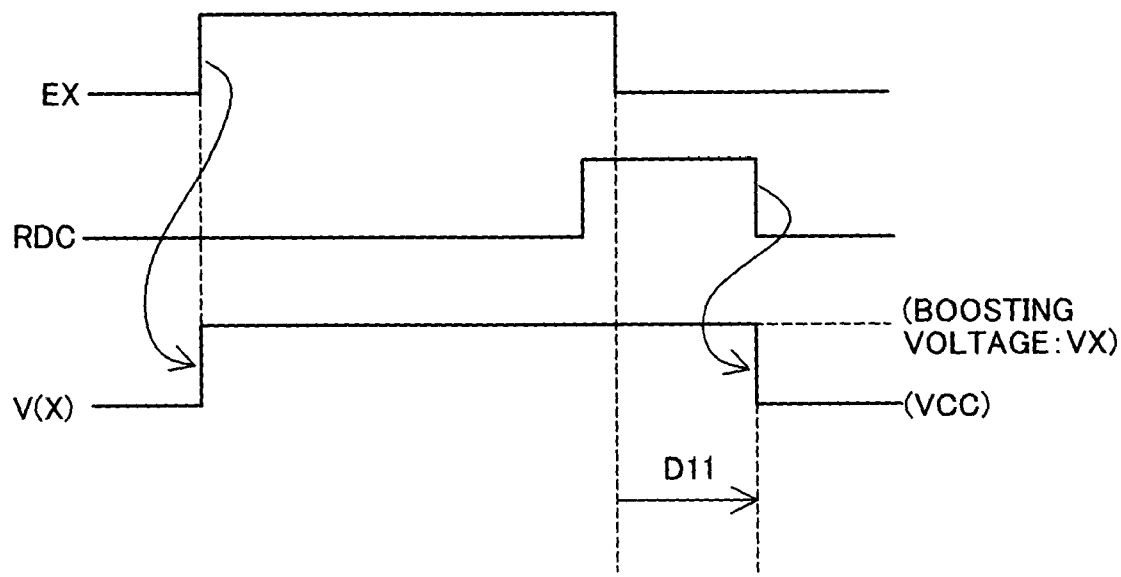
FIG. 6 is operational waveform of the first specific example directed to the first embodiment.

FIG. 6 shows the circuit operation of the first specific example. As transition of the enable signal EX to a high level occurs, the voltage generator section VG1 is activated and the boosting voltage VX is outputted to the bias voltage terminal V(X). At this point, the output terminal of a latch circuit shifts to a low level, which is then applied to the source terminal of the NMOS transistor N1. On the other hand, a high-level signal inverted at the inverter gate I1 is applied to the source terminal of the NMOS transistor N2. The low-level signal outputted from the latch circuit is applied to the gate terminal of the PMOS transistor P3 via the NMOS transistor N1, thus setting the PMOS transistor P3 conductive. As a result, electrical connection between the gate terminals of the PMOS transistors P1, P2 and the bias voltage terminal V(X) is set up. Since the boosting voltage VX is applied by the voltage generator section VG1, the PMOS transistors P1 and P2 have no conductivity and the voltage discharger section VD1 maintains its inactive state.

Before low-level transition of the enable signal EX, high-level transition of the read control signal RDC occurs. During the high-level period of the read control signal RDC, the output terminal of the latch circuit is maintained at a low level and the voltage discharger section VD1 maintains its inactive state, irrespective of the logical level of the enable signal EX.

After the low level transition of the enable signal EX, on completion of low-level transition of the read control signal RDC, transition of the output terminal of the latch circuit to a high level occurs and the logical state is inverted. A low-level signal is applied to the gate terminals of the PMOS transistors P1 and P2 via the NMOS transistor N2 instead of the NMOS transistor N1. This sets the PMOS transistors P1 and P2 conductive and hence electrical connection between the bias voltage terminal V(X) and the power source voltage VCC. At timing prior to this, low-level transition of the enable signal EX occurs and the voltage generator section VG1 is already inactive. Therefore, at timing of low-level transition of the read control signal RDC, the bias voltage terminal V(X) is discharged to the power source voltage VCC. The latch circuit has a function to mask low-level transition of the enable signal EX by using the high-level state of the read control signal RDC, and constitutes a response delay section for the enable signal EX.

In the case where the read control signal RDC shifts to a high level and is activated at timing when the enable signal EX shifts to a low level and is inactivated, the voltage discharger section VD1 is not started and the discharge operation of the bias voltage terminal V(X) is not carried out. This state continues for a period during which the read control signal RDC is at the high level. As the read control signal RDC shifts to a low level and is inactivated, the voltage discharger section VD1 is started and the bias voltage terminal V(X) is discharged. During a period D11 from the low-level transition of the enable signal EX to the low-level transition of the read control signal RDC, voltage transition of the bias voltage terminal V(X) is delayed.

The first specific example of the first embodiment is an exemplary circuit structure in the case of discharging the boosting voltage VX applied to the bias voltage terminal V(X), to the power source voltage VCC. This example can be applied to the write bit line voltage generator circuit 16A, the word line voltage generator circuit 16B and the well voltage generator circuit 16D, which generate the write bit line voltage VWB, the word line voltage VWL+ and the well voltage VWE of a high voltage level, respectively.

As for the negative word line voltage generator circuit 16C for generating the word line voltage VWL−, which is a negative voltage, a voltage generator circuit for discharging a negative voltage to the ground voltage VSS can be constituted by reversing the conductivity type of the MOS transistors between P-type and N-type and reversing the connection to the ground voltage VSS to connection to the power source voltage VCC, though not shown. Also in this case, by providing a latch circuit, inactivation of the enable signal EX can be masked by an active signal of the read control signal RDC and the discharge timing of the bias voltage terminal V(X) can be delayed.

Figure 7:
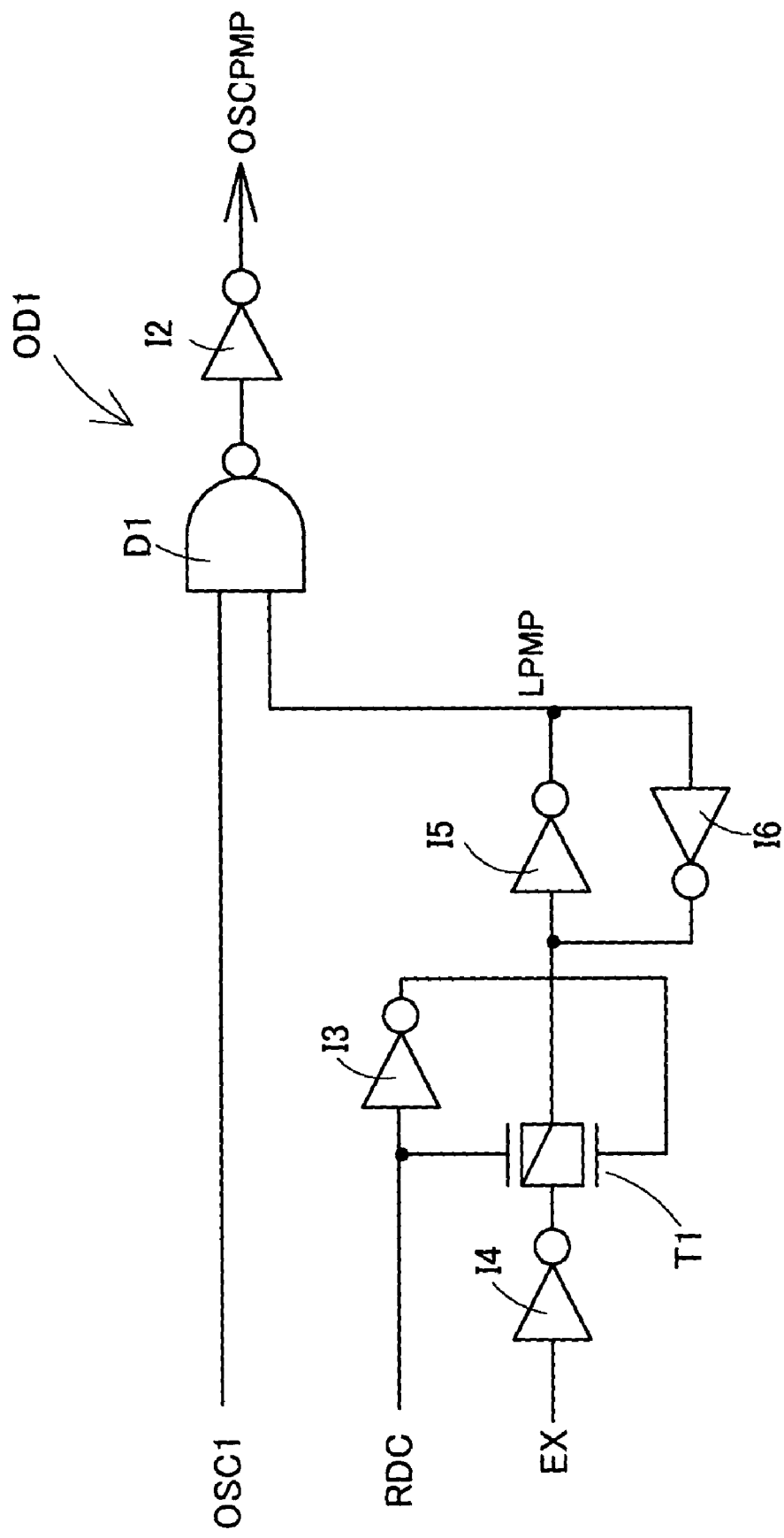
FIG. 7 is a circuit diagram of a second specific example directed to the first embodiment.

FIG. 7 shows a second specific example of the first embodiment. The second specific example is an exemplary circuit structure applied in the case where a voltage boosting circuit or a negative voltage circuit using a charge pump system is used as the voltage generator circuits 16A to 16D. FIG. 7 shows an oscillation delay section OD1 for performing delay control of a charge pump dedicated oscillation signal OSCPMP of the voltage generator circuits 16A to 16D. It shows an exemplary circuit structure for masking and delaying the timing of start and end of application of a bias voltage VX.

In the oscillation delay section OD1 of the second specific example, an original oscillation signal OSC1 from a charge pump dedicated original oscillator (not shown) is outputted as a charge pump dedicated oscillation signal OSCPMP via a NAND gate D1 and an inverter gate I2. The output terminal of a latch circuit made up of inverter gates I5 and I6 is connected to the other input terminal of the NAND gate D1. The enable signal EX is latched to the latch circuit via an inverter gate I4 and a transfer gate T1. The enable signal EX to be latched is controlled by opening/closing of the transfer gate. The read control signal RDC is inputted directly to the gate terminal of a PMOS transistor and also inputted to the gate terminal of an NMOS transistor via an inverter gate I3. With the read control signal RDC at a low level, the logical level of the enable signal EX is taken in the latch circuit.

Figure 8:
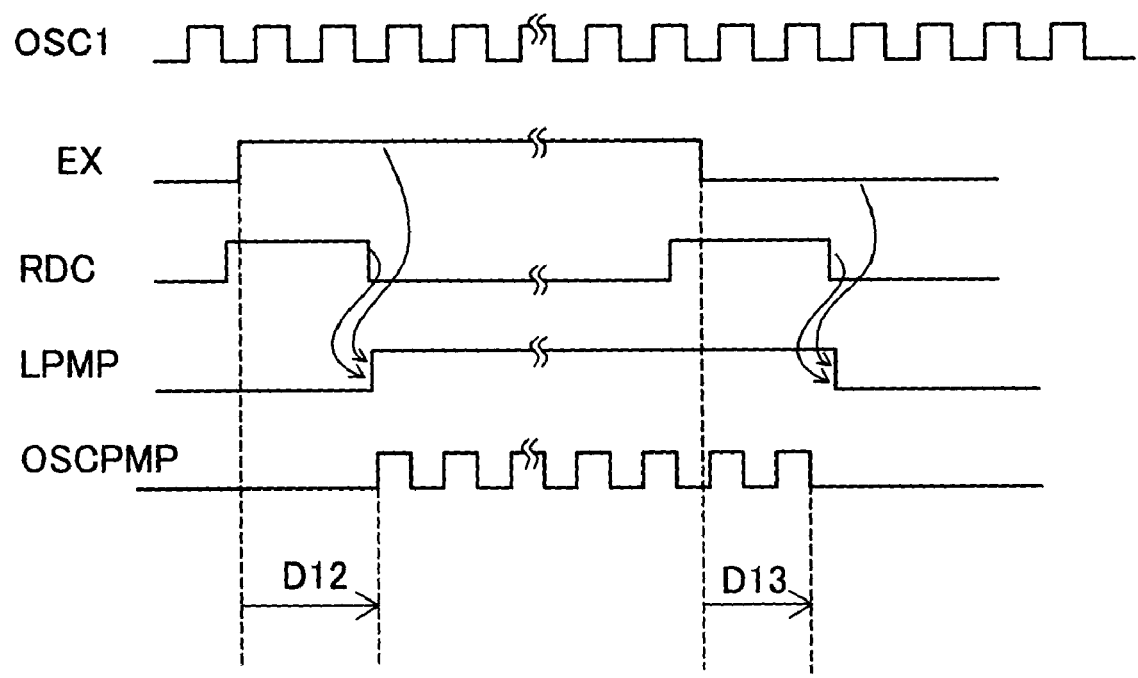
FIG. 8 is operational waveform of the second specific example directed to the first embodiment.

FIG. 8 shows the circuit operation of the second specific example of the first embodiment. Before high-level transition of the enable signal EX, high-level transition of the read control signal RDC occurs. During the high-level period of the read control signal RDC, the transfer gate T1 is maintained in a non-conductivity state irrespective of the logical level of the enable signal EX. Therefore, the enable signal EX after the high-level transition is not taken in the latch circuit made up of the inverter gates I5 and I6. A latch signal LPMP outputted from the latch circuit maintains a low-level signal since before the high-level transition of the enable signal EX.

Since the output terminal of the NAND gate D1 is fixed at a high level by the low-level latch signal LPMP, the charge pump dedicated oscillation signal OSCPMP is fixed at a low level. Therefore, the charge pump operation is not started.

As low-level transition of the read control signal RDC occurs, conductivity of the transfer gate T1 is set up. At this point, the enable signal EX at a high level is taken in the latch circuit and the latch signal LPMP is inverted to a high level. Thus, the original oscillation signal OSC1 is outputted as the charge pump dedicated oscillation signal OSCPMP via the NAND gate D1 and the inverter gate I2. During a period D12 from the high-level transition of the enable signal EX to the low-level transition of the read control signal RDC, the start of the charge pump operation in the voltage generator circuits 16A to 16D is delayed and voltage supply to the bias voltage terminal V(X) is delayed.

Before low-level transition of the enable signal EX, high-level transition of the read controls signal RDC occurs. Also in this case, during the high-level period of the read control signal RDC, the transfer gate T1 is similarly maintained in a non-conductivity state and the latch signal LPMP outputted from the latch circuit maintains a high-level signal.

The original oscillation signal OSC1 is continuously outputted as the charge pump dedicated oscillation signal OSCPMP via the NAND gate D1 and the inverter gate I2 by the high-level latch signal LPMP.

As low-level transition of the read control signal RDC occurs, conductivity of the transfer gate T1 is set up. The low-level enable signal EX is taken in the latch circuit and the latch signal LPMP is inverted to a low level. Thus, the output terminal of the NAND gate D1 is fixed at a high level and the charge pump dedicated oscillation signal OSCPMP is fixed at a low level. During a period D13 from the low-level transition of the enable signal EX to the low-level transition of the read control signal RDC, the end of the charge pump operation in the voltage generator circuits 16A to 16D is delayed and the stop of voltage supply to the bias voltage terminal V(X) is delayed.

Figure 9:
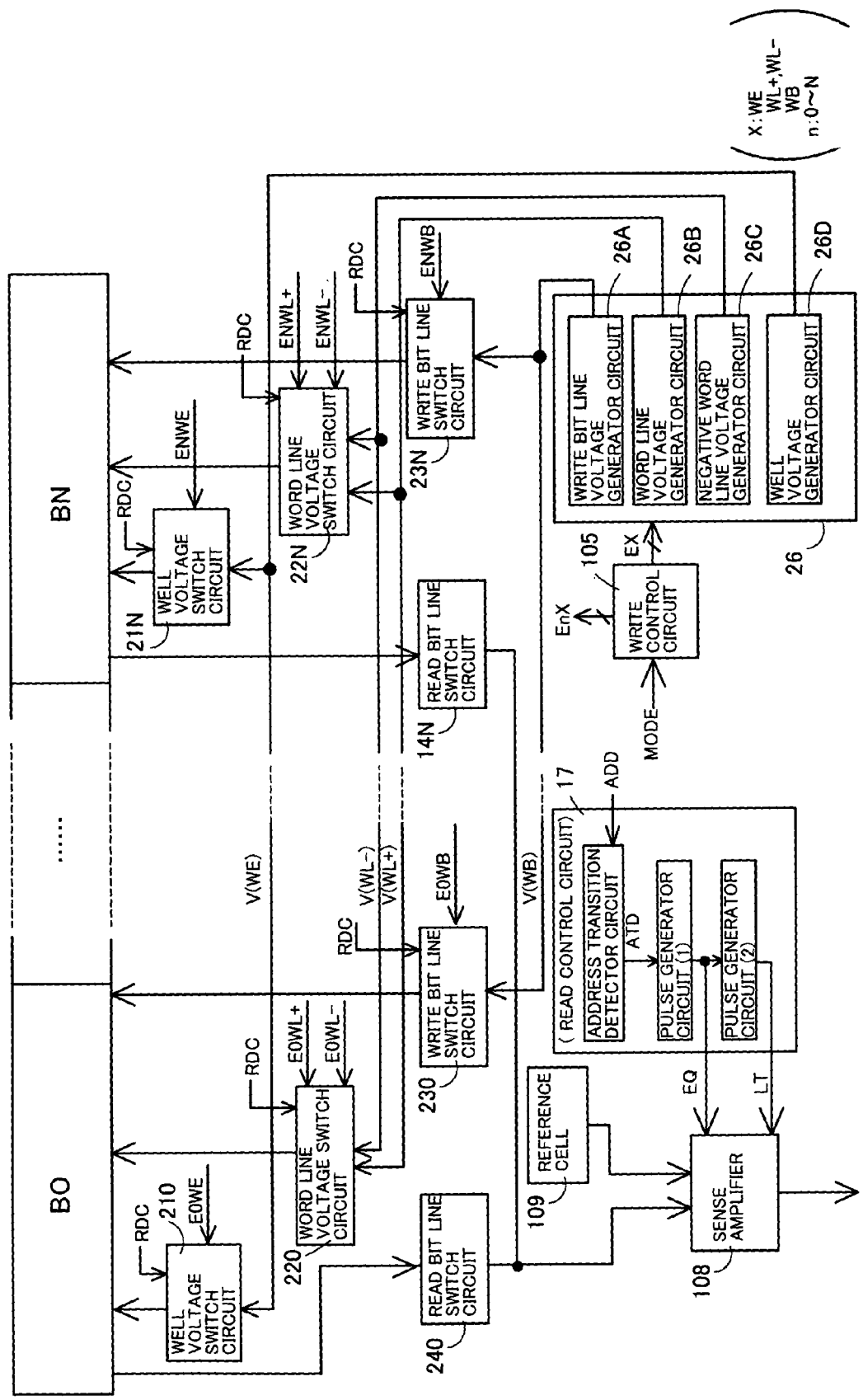
FIG. 9 is a circuit block diagram of a semiconductor memory directed to a second embodiment.

FIG. 9 shows a circuit block diagram of a semiconductor memory of a second embodiment. The semiconductor memory of the second embodiment has well voltage switch circuits 210 to 21N, word line voltage switch circuits 220 to 22N, and write bit line switch circuits 230 to 23N, instead of the various switch circuits 110 to 11N, 120 to 12N and 130 to 13N of the semiconductor memory of the first embodiment. A read control signal RDC is inputted to these switch circuits 210 to 21N, 220 to 22N, and 230 to 23N. Moreover, a voltage generator circuit 26 is provided instead of the voltage generator circuit 16. The read control signal RDC is not inputted to voltage generator circuits 26A to 26D.

The inputted read control signal RDC masks enable signals E0WE to ENWE, E0WL+/− to ENWL+/−, and E0WB to ENWB. When the read control signal RDC is not active, the switch circuits 210 to 21N, 220 to 22N, and 230 to 23N are selected in accordance with the enable signals E0WE to ENWE, E0WL+/− to ENWL+/−, and E0WB to ENWB outputted from a write control circuit 105, and various bias voltages VWB, VWL+, VWL−, and VWE are supplied to the selected bank. When the read control signal RDC is active, the enable signals E0WE to ENWE, E0WL+/− to ENWL+/−, and E0WB to ENWB are masked and no bias voltage is supplied to the bank.

In accordance with the timing of start and end of application of each bias voltage to the selected bank, masking of the enable signals by the read control signal RDC is carried out. Thus, voltage transition of the bias voltage in the data write operation is not propagated to the selected bank at the timing of activation of the read control signal RDC when memory data of a small amplitude voltage is outputted in the data readout operation.

Figure 10:
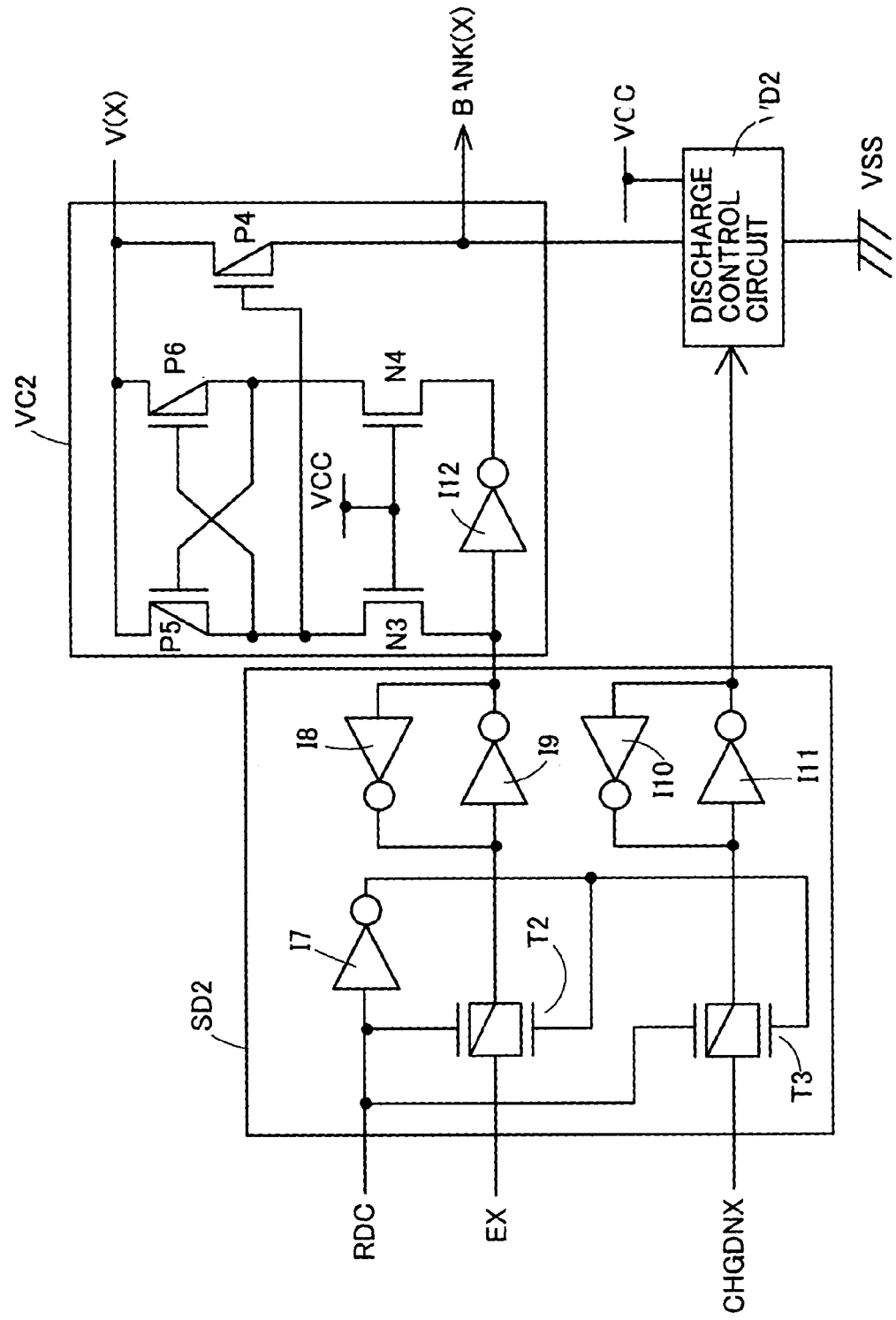
FIG. 10 is a circuit diagram of a specific example directed to the second embodiment.

A specific example of the second embodiment shown in FIG. 10 is a specific example of the well voltage switch circuits 210 to 21N, the word line voltage switch circuits 220 to 22N, and the write bit line switch circuits 230 to 23N, which supply boosting voltages. However, with respect to the word line voltage switch circuits 220 to 22N, a circuit applied to a switch circuit for the bias voltage VWL+ is used. FIG. 10 shows an exemplary circuit structure for masking and delaying the timing of start and end of supply in the case of supplying the bias voltages VWE and VWB (generally referred to as VX) from the voltage generator circuits 26D and 26A to the selected bank.

A discharge control circuit VD2 controlled by a discharge control signal CHGDNX and the read control signal RDC when discharging a bank bias terminal BANK(X) to a power source voltage VCC or a ground voltage VSS, and a voltage charger section VC2 controlled by the enable signal EX and the read control signal RDC when supplying the bias voltage VX are provided.

The voltage charger section VC2 has PMOS transistors P4 to P6, NMOS transistors N3, N4, and an inverter gate I12. The voltage charger section VC2 has a structure similar to that of the first specific example (FIG. 5) of the first embodiment having the PMOS transistors P1 to P3, the NMOS transistors N1, N2, and the inverter gate I1. The voltage charger section VC2 has a function to shift the voltage amplification level of the enable signal EX and the read control signal RDC and thus control conductivity of the PMOS transistor P4.

The enable signal EX and the discharge control signal CHGDNX are connected to a latch circuit made up of inverter gates I8, I9 and a latch circuit made up of inverter gates I10, I11 via transfer gates T2 and T3, respectively. Opening/closing control of the transfer gates is performed by the read control signal RDC. These elements constitute a switch delay section SD2. The logical levels of these signals in the state where the read control signal RDC is at a low level are taken in the latch circuits. This is a structure similar to that of the second specific example (FIG. 7) of the first embodiment. Selection control of the switch circuits is performed in accordance with the logical levels of the enable signal EX and the discharge control signal CHGDNX taken in the latch circuit.

Figure 11:
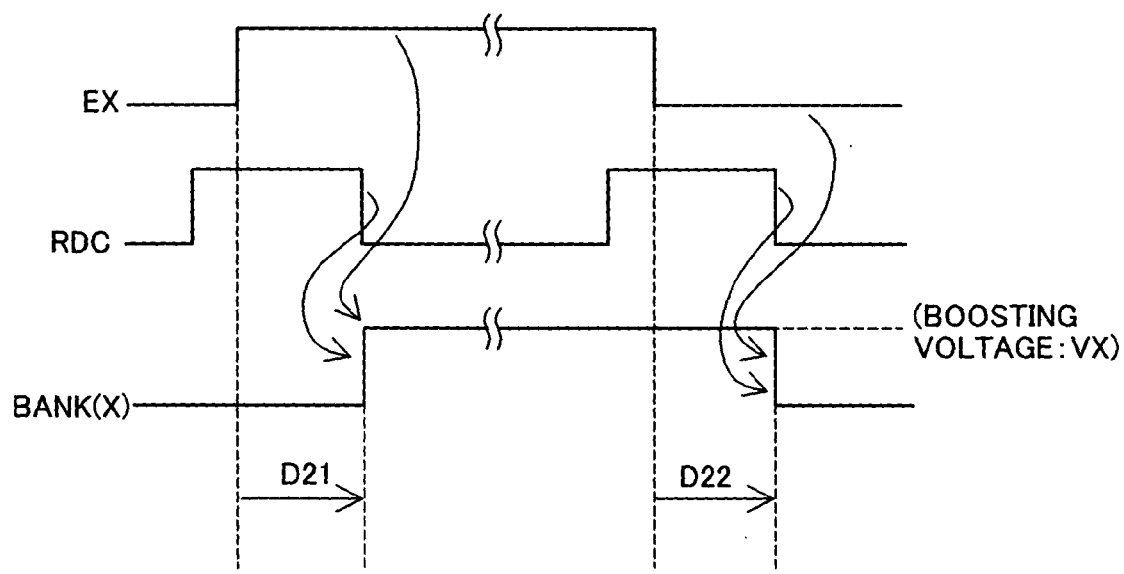
FIG. 11 is an operational waveform of the specific example directed to the second embodiment.

FIG. 11 shows the circuit operation of the specific example of the second embodiment. Before high-level transition of the enable signal EX, high-level transition of the read control signal RDC occurs. During the high-level period of the read control signal RDC, the transfer gates T2 and T3 are maintained in a non-conductivity state. Therefore, the latch signal outputted from the latch circuit is maintained at a high level.

In the voltage charger section VC2, the high-level signal outputted from the latch circuit is inverted by the inverter gate I12 and biases the gate terminal of the PMOS transistor P5 to a low level via the NMOS transistor N4. Thus, the PMOS transistor P4 is maintained in a non-conductivity state.

Meanwhile, the discharge control signal CHGDNX is a signal of the same phase as the enable signal EX, though not shown. Therefore, also the output signal from the latch circuit made up of the inverter gates I10 and I11 is at a high level. This high-level signal activates the discharge control circuit VD2 and the bank bias terminal BANK(X) maintains the discharged state.

As low-level transition of the read control signal RDC occurs, conductivity of the transfer gates T2 and T3 is set up. At this point, the enable signal EX and the discharge control signal CHGDNX, both of which are high-level signals, invert the respective latch circuits and low-level signals are outputted. The discharge control circuit VD2 in inactivated and conductivity of the PMOS transistor P4 in the voltage charger section VC2 is set up, thus supplying the bias voltage VX to the bank bias terminal BANK(X) via the bias voltage terminal V(X). During a period D21 from the high-level transition of the enable signal EX to the low-level transition of the read control signal RDC, the bias voltage VX is not supplied to the bank bias terminal BANK(X) and the voltage supply is delayed.

Before low-level transition of the enable signal EX and the discharge control signal CHGDNX, high-level transition of the read control signal RDC occurs. Also in this case, during the high-level period of the read control signal RDC, the transfer gates T2 and T3 are similarly maintained in a non-conductivity state and the latch signal outputted from the latch circuit maintains a low-level signal. The bias voltage VX is continuously outputted to the bank bias terminal BANK(X).

As low-level transition of the read control signal RDC occurs, conductivity of the transfer gates T2 and T3 is set up. The low-level enable signal EX and discharge control signal CHGDNX are taken in the latch circuit, and the latch signal is inverted to a high level. The supply of the bias voltage VX to the bank bias terminal BANK(X) by the voltage charger section VC2 is stopped and the bank bias terminal BANK(X) is discharged by the discharge control circuit VD2. During a period D22 from the low-level transition of the enable signal EX to the low-level transition of the read control signal RDC, the bias voltage VX is supplied to the bank bias terminal BANK(X) and the stop of the voltage supply is delayed.

The specific example of the second embodiment is an exemplary structure of a switch circuit in the case of supplying the boosting voltage VX to the bank bias terminal BANK(X). In the word line voltage switch circuits 220 to 22N, the word line voltage VWL−, which is a negative voltage, must be switched. As for these circuits, a switch circuit for supplying a negative voltage can be constituted by reversing the conductivity type of the MOS transistors between P-type and N-type and reversing the connection to the ground voltage VSS to connection to the power source voltage VCC, though not shown. Also in this case, by providing the transfer gates I2, I3 and the latch circuit, and performing latch control of the enable signal EX and the discharge control signal CHGDNX using the read control signal RDC, the timing of supply of the bias voltage of the negative voltage to the bank bias terminal BANK(X) can be delayed.

As described above in detail, according to the first and second embodiments, the data write operation is controlled on the basis of at least one predetermined first signal (generally referred to as read control signal RDC) of the control signals ATD, EQ and LT exhibiting a predetermined state in the data readout operation. Specifically, execution response of voltage transition of the various bias voltages VWE, VWL+/− and VWB to the enable signal EX can be delayed by the Latch circuit in the voltage discharger section VD1, the oscillation delay section OD1 or the switch delay section SD2.

The data readout operation is an example of the first operation state, and the readout state of the small amplitude voltage signal by the sense amplifier 108 is equivalent to the predetermined state. At least one of the control signals ATD, EQ and LT (generally referred to as read control signal RDC) is an example of the predetermined first signal. The data write operation is an example of the second operation step or the second operation sequence by the sequence control section. The Latch circuit in the voltage discharger section VD1, the oscillation delay section OD1 or the switch delay section SD2 is an example of the response delay step or the response delay section. The voltage transition of the various bias voltages VWE, VWL+/− and VWB is an example of the predetermined state transition. The transition of the logical level of the enable signal EX is an example of the instruction of the predetermined state transition.

At the time of readout, during a period when read-out memory data and reference data are small amplitude signals and the voltage difference between these data when being differentially amplified is a small amplitude voltage, large voltage transition and current transition as in the write operation do not occur. The small amplitude signal readout operation is not affected by the noise due to the write operation, and a stable readout operation can be carried out even in the case where the readout operation and the write operation are independently performed.

In the case where the readout operation and the write operation are simultaneously performed, the timing of transition of the voltage or current in the write operation is delayed, thus eliminating the influence of noise on the readout operation. The readout operation is not delayed and a stable readout operation can be secured at a high speed. Moreover, the delay time in the write operation can be limited to the processing period for the small amplitude signal in the readout operation. The delay time is very short in comparison with the long write time and the overhead of the delay time occupying the write operation time can be neglected.

Figure 12:
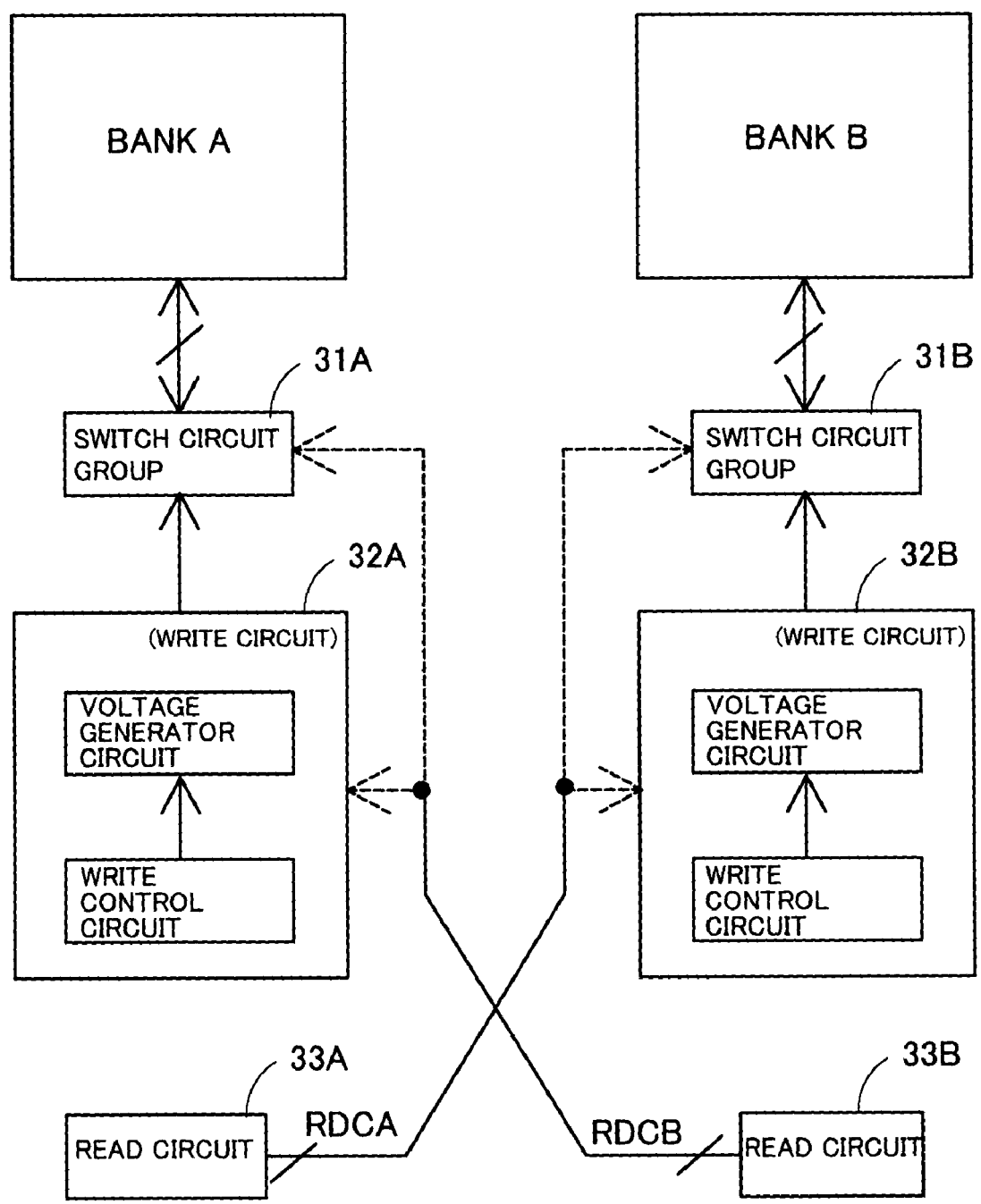
FIG. 12 is a circuit block diagram of a semiconductor memory directed to a third embodiment.

FIG. 12 shows a circuit block diagram of a semiconductor memory of a third embodiment. In the third embodiment, switch circuit groups 31A and 31B are provided for banks A and B, respectively, and write circuits 32A and 32B and read circuits 33A and 33B are provided. To the write circuits 32B and 32A or the switch circuit groups 31B and 31A provided for the banks B and A, respectively, read control signals RDCA and RDCB from the read circuits 33A and 33B provided for the other banks A and B, respectively, are inputted.

As the read control signals RDCA and RDCB act on voltage generator circuits in the write circuits 32B and 32A, the timing of voltage transition of bias voltages generated in the data write operation for the respective banks can be delayed, as in the first embodiment. As the read control signals RDCA and RDCB act on the switch circuit groups 31B and 31A, the timing of switching application of the bias voltage VX to a selected bank can be delayed, as in the second embodiment.

According to the third embodiment, voltage transfer of the bias voltage as in the data write operation does not occur at the timing of activation of the read control signal when memory data of a small amplitude voltage is outputted in the data readout operation.

In the third embodiment, the data write operations for the two banks A and B are controlled by inputting the read control signals RDCA and RDCB to the other banks B and A. However, a similar structure can be used for a semiconductor memory having three or more banks. In this case, it is preferred that the read control signal for controlling the data write operation is a read control signal from a bank that is most affected by the noise from a bank where the data write operation is carried out. When plural banks are affected by the noise, a logical sum signal of read control signals from these banks can be used. Moreover, the read control signals can be properly combined to perform control.

Figure 13:
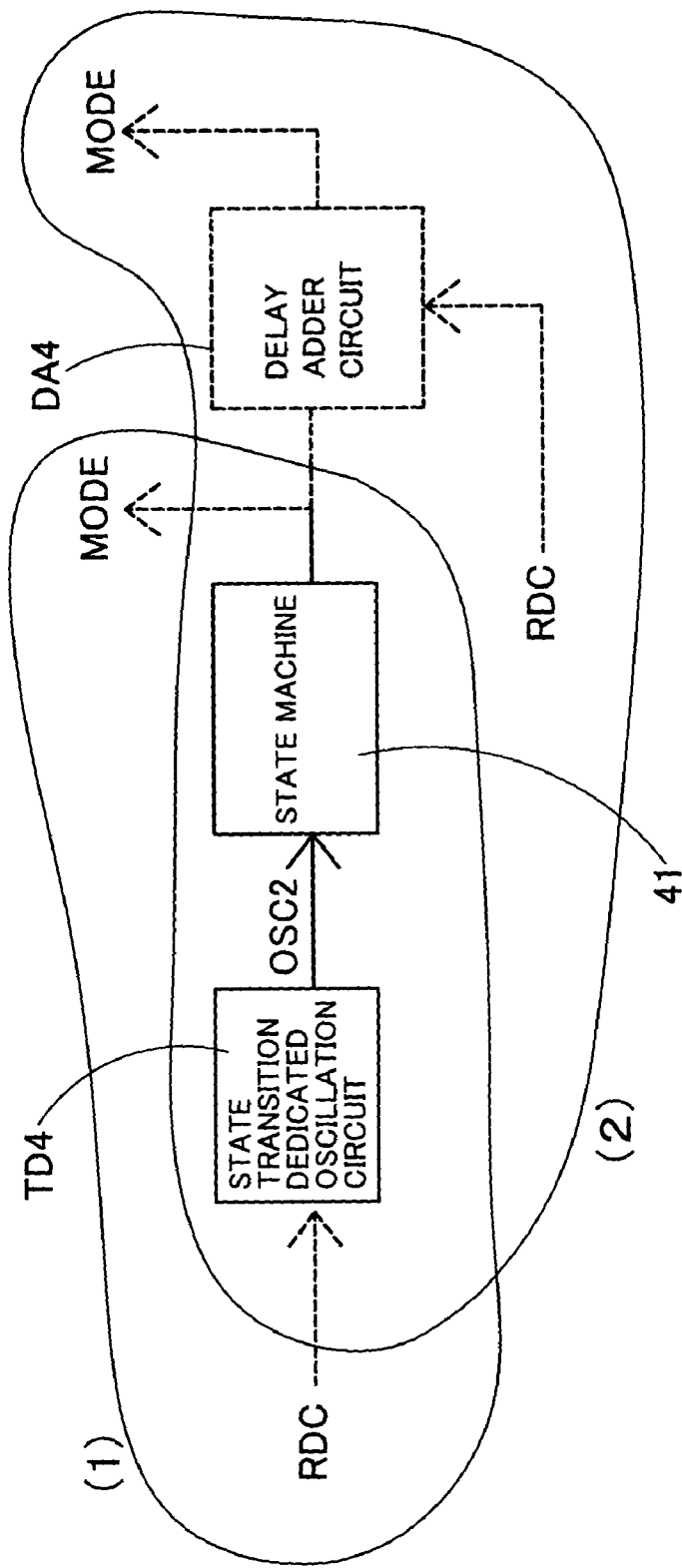
FIG. 13 is a circuit block diagram of a mode control section in a semiconductor memory directed to a fourth embodiment.

A fourth embodiment shown in FIG. 13 is an embodiment of mode control section for outputting a mode signal MODE for instructing state transition. In a part indicated by (1) in FIG. 13, a state transition dedicated oscillation circuit TD4 is controlled by the read control signal RDC. A state oscillation signal OSC2 is outputted from the state transition dedicated oscillation circuit TD4, delayed in accordance with the read control signal RDC. A state machine 41 operates on the basis of this state oscillation signal OSC2. As the timing of state transition is taken, a mode signal MODE is outputted. The state transition dedicated oscillation circuit TD4 constitutes a timer delay section. This will be described in detail in first and second specific examples (FIGS. 14 to 17). In a part indicated by (2), the state machine 41 is controlled on the basis of the state oscillation signal OSC2 from the state transition dedicated oscillation circuit TD4. An output signal from the state machine 41 is inputted to a delay adder circuit DA4, where a delay is added to the signal in accordance with the read control signal RDC and the mode signal MODE is outputted. The delay adder circuit DA4 constitutes a delay adder section. This will be described in detail in a third specific example (FIG. 18).

Figure 14:
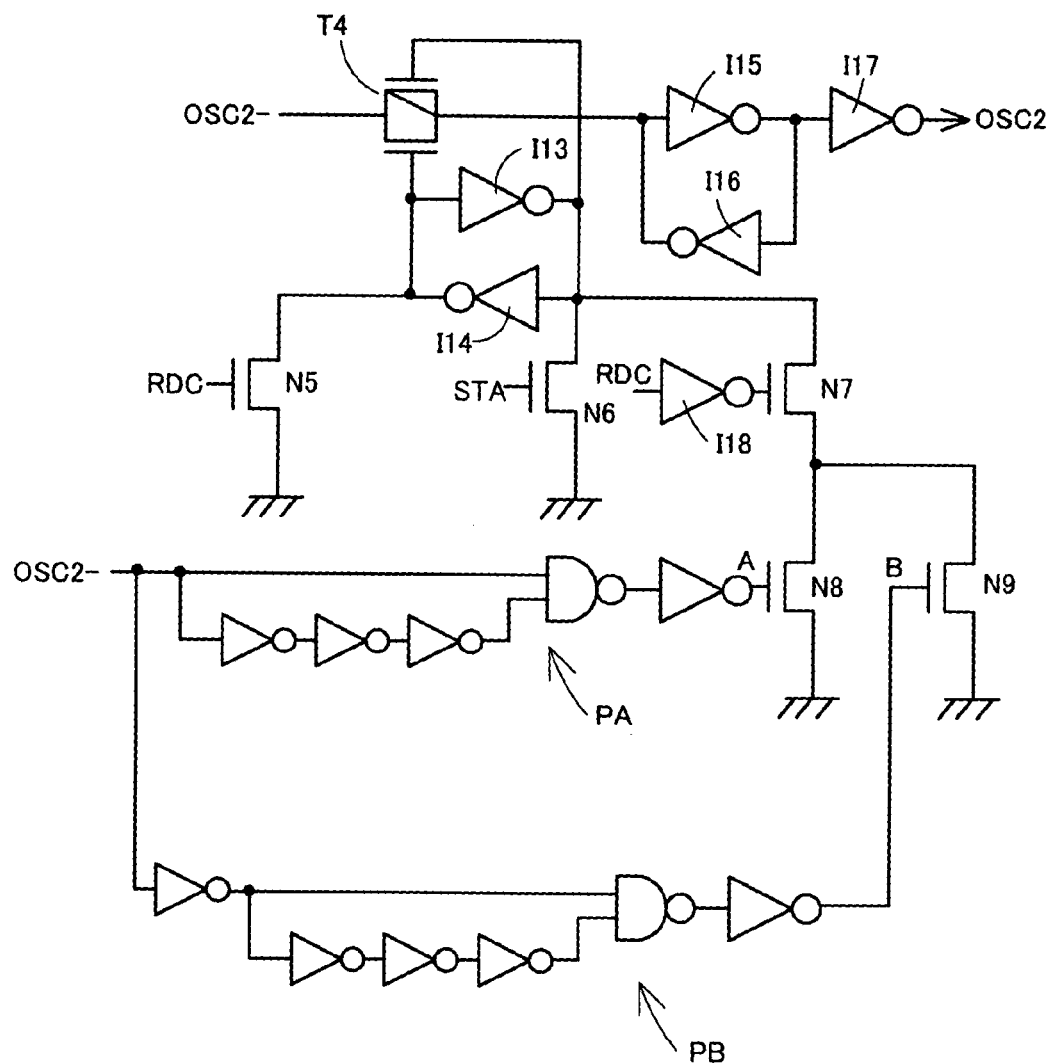
FIG. 14 is a circuit diagram of a first specific example directed to the fourth embodiment.
Figure 15:
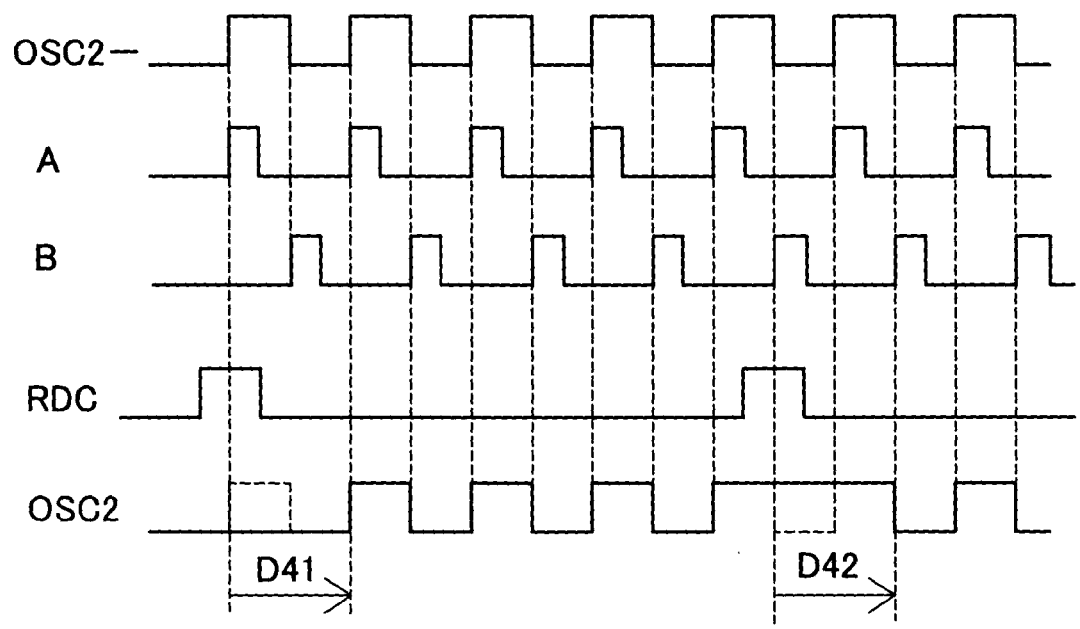
FIG. 15 is an operational waveform of the first specific example directed to the fourth embodiment.

A first specific example of the fourth embodiment shown in FIG. 14 is an exemplary circuit structure of the state transition dedicated oscillation circuit TD4 for performing delay control of the state oscillation signal OSC2, which is propagated from an original state oscillation signal OSC2- and then outputted, by an oscillation cycle using the read control signal RCD.

The original state oscillation signal OSC2- is taken in a latch circuit made up of inverter gates I15 and I16 via a transfer gate T4. An inversion output signal from the latch circuit is re-inverted via an inverter gate I17 and outputted as the state oscillation signal OSC2. To the gate terminals of PMOS/NMOS transistors constituting the transfer gate T4, the output terminals of inverter gates I13 and I14 are connected. The inverter gates I13 and I14 constitute a latch circuit.

Also an NMOS transistor N5 is connected to the gate terminal of the NMOS transistor of the transfer gate T4. Conductivity of the NMOS transistor N5 to the ground voltage VSS is controlled by the read control signal RDC inputted to its gate terminal. NMOS transistors N6 and N7 are connected to the gate terminal of the PMOS transistor of the transfer gate T4. The gate terminal of the NMOS transistor N6 is controlled by a start signal STA and its conductivity to the ground voltage VSS is thus controlled. NMOS transistors N8 and N9 are connected in parallel between the NMOS transistor N7 and the ground voltage VSS. The read control signal RDC is inverted via an inverter gate I18 and inputted to the gate terminal of the NMOS transistor N7. Pulse generator circuits PA and PB are connected to the gate terminals of the NMOS transistors N8 and N9, respectively.

The pulse generator circuits PA and PB have the same circuit structure, in which an output signal from a NAND gate is inverted at an inverter gate and a positive pulse is outputted. To each NAND gate, the original state oscillation signal OSC2- and its inversion delay signal, and an inversion signal of the original state oscillation signal OSC2- and its inversion delay signal are inputted. The pulse generator circuit PA generates a positive pulse with respect to leading state transition of the original state oscillation signal OSC2-. The pulse generator circuit PB generates a positive pulse with respect to trailing state transition of the original state oscillation signal OSC2-.

The circuit operation will now be described. As the circuit is started up, the start signal STA becomes a high-pulse signal. Therefore, the latch circuit of the inverter gates I13 and I14 is set and conductivity of the transfer gate T4 is set. A steady state is set in which the original state oscillation signal OSC2- is outputted as it is as the state oscillation signal OSC2. This state is the operation state shown in FIG. 15.

When the read control signal RDC is at a low level in the steady state, conductivity of the NMOS transistor N7 is set up and pulse signals A and B become positive pulses in leading/trailing state transition of the original state oscillation signal OSC2-. Thus, conductivity of the NMOS transistors N8 and N9 is alternately set up, continuously supplying a low-level signal to the output terminal of the inverter gate I13 of the latch circuit via the NMOS transistor N7. During this time, the NMOS transistor N5 maintains its non-conductivity state. Therefore, the transfer gate T4 maintains conductivity.

As leading/trailing state transition of the original state oscillation signal OCS2- occurs and the read control signal RDC shifts to a high level, the pulse signals A and B are masked. When the NMOS transistor N7 has no conductivity, conductivity of the NMOS transistor N5 is set up. While supply of a low-level signal to the output terminal of the inverter gate I13 by the pulse signals A and B is interrupted, a low-level signal is supplied to the output terminal of the inverter gate I14. The signal latched by the latch circuit is inverted and the transfer gate T4 has no conductivity. Thus, the leading/trailing state transition of the original state oscillation signal OSC2- is not propagated and the state oscillation signal OSC2 is fixed at the logical level latched by the inverter gates I15 and I16. That is, the logical level prior to the state transition is outputted and the oscillation signal is thinned out. As the pulse signal A is masked, high-level transition of the state oscillation signal OSC2 is thinned out. As the pulse signal B is masked, low-level transition of the state oscillation signal OSC2 is thinned out.

The state machine 41 counts the number of oscillations of the state oscillation signal OSC2 and takes the timing of state transition. Therefore, as the oscillation operation of the state oscillation signal OSC2 is thinned out, the timing of state transition can be delayed by the oscillation cycle of the state oscillation signal OSC2. When the pulse signal A is masked, the low-level period of the state oscillation signal OSC2 continues for one cycle D41. When the pulse signal B is masked, the high-level period of the state oscillation signal OSC2 continues for one cycle D42.

Figure 16:
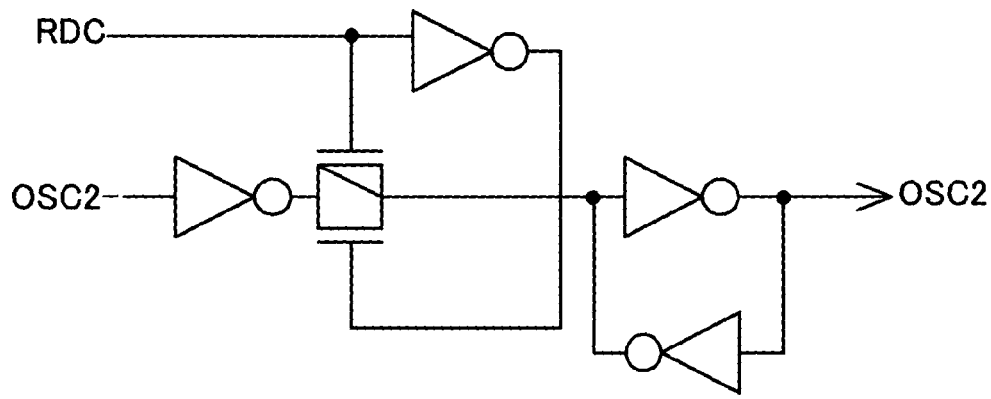
FIG. 16 is a circuit diagram of a second specific example directed to the fourth embodiment.

A second specific example of the fourth embodiment shown in FIG. 16 is an exemplary circuit structure of the state transition dedicated oscillation circuit TD4 for performing delay control of the state oscillation signal OSC2, which is propagated from the original state oscillation signal OSC2- and then outputted, during a high-level period when the read control signal RDC is active.

Similar to the first specific example (FIG. 14) of the fourth embodiment, the path from the original state oscillation signal OSC2- to the state oscillation signal OCS2 includes a transfer gate, a latch circuit and inverter gates. A control signal to the transfer gate is supplied by the read control signal RDC, unlike the first specific example (FIG. 14) of the fourth embodiment. During a period when the read control signal RDC is at a high level, the transfer gate has no conductivity. State transition is delayed in the case where the read control signal RDC shifts to a high level at the timing of leading/trailing state transition of the state oscillation signal OSC2.

Figure 17:
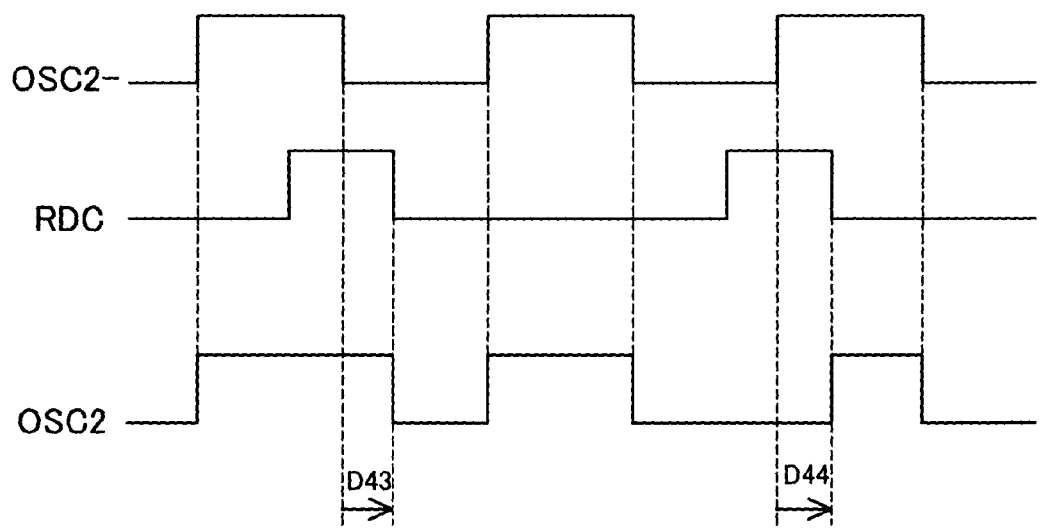
FIG. 17 is an operational waveform of the second specific example directed to the fourth embodiment.
Figure 18:
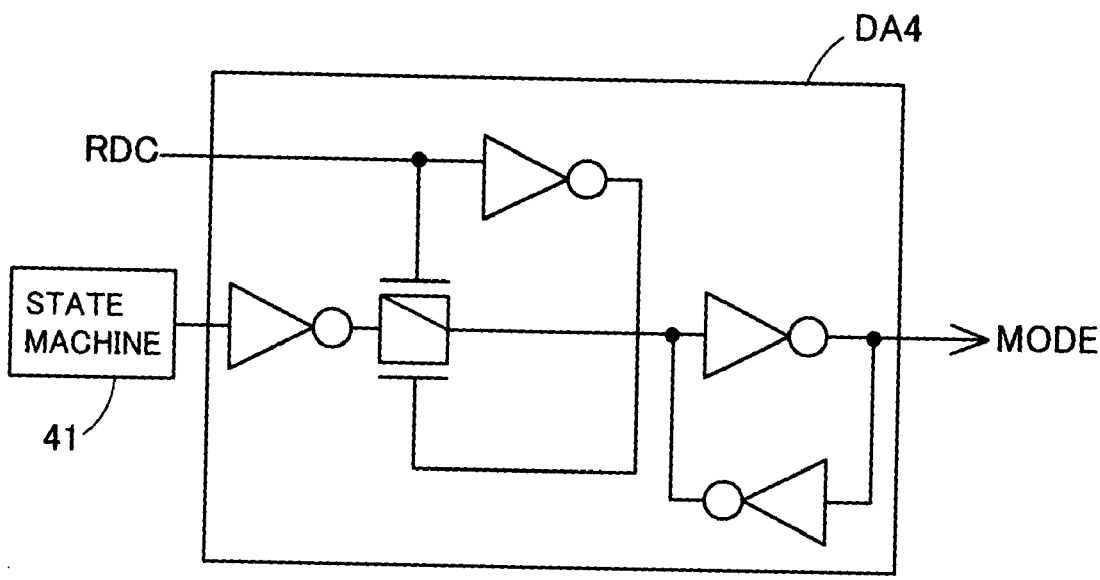
FIG. 18 is a circuit diagram of a third specific example directed to the fourth embodiment.

FIG. 17 shows the circuit operation of the second specific example of the fourth embodiment. Before leading/trailing state transition of the original state oscillation signal OSC2-, high-level transition of the read control signal RDC occurs. During the high-level period of the read control signal RDC, the transfer gate is maintained in a non-conductivity state and therefore the state oscillation signal OSC2 is fixed at a logical level latched by the latch circuit.

When low-level transition of the read control signal RDC occurs, conductivity of the transfer gate is set up. The original state oscillation signal OSC2- following the state transition is taken in the latch circuit and the state oscillation signal OSC2 is inverted. During periods D43 and D44 from the state transition of the original state oscillation signal OSC2- to the low-level transition of the read control signal RDC, the timing of state transition of the state oscillation signal OSC2 is delayed.

A third specific example of the fourth embodiment shown in FIG. 18 is an exemplary circuit structure of the delay adder circuit DA4 for performing delay control of the mode signal MODE with respect to an output signal from the state machine 41 during a high-level period of the read control signal RDC which is active.

The specific circuit structure and circuit operation are similar to those of the second specific example (FIGS. 16 and 17) of the fourth embodiment and therefore will not be described further in detail. During a period when the read control signal RDC is at a high level, the transfer gate has not conductivity. State transition is delayed in the case where the read control signal RDC shifts to a high level at the timing of state transition of the output signal from the state machine 41.

As described above in detail, according to the first or second specific example of the fourth embodiment, since the timing of supplying the state oscillation signal OSC2 can be delayed from the original state oscillation signal OSC2- by the state transition dedicated oscillation circuit TD4 with respect to the state machine 41, predetermined voltage or current transition in the data write operation controlled by the state machine 41 can be delayed.

The state machine 41 is an example of the state transition instruction step or sequence control section for controlling the second operation sequence, which is the data write operation. The original state oscillation signal OSC2- is an example of the timer information prior to being delay-controlled. The state oscillation signal OSC2 is an example of the timer information after being delay-controlled. The original state oscillation signal OSC2- is generated by the timer step or timer section, and the state oscillation signal OSC2 is generated by the timer delay step or timer delay section. The state transition dedicated oscillation circuit TD4 has a structure including both the timer step or timer section and the timer delay step or timer delay section. The first or second specific example is an example of the timer delay step or timer delay section.

According to the third specific example of the fourth embodiment, the mode signal MODE from the state machine 41 can be delayed by the delay adder circuit DA4.

The delay adder circuit DA4 is an example of the delay addition step or delay adder section. The state machine 41 is an example of the state transition instruction step or sequence control section for controlling the second operation sequence, which is the data write operation. The mode signal MODE is an instruction of predetermined state transition from the state transition instruction step or at least one predetermined control signal from the sequence control section.

At the time of readout, during a period when read-out memory data and reference data are small amplitude signals and the voltage difference between these data when being differentially amplified is a small amplitude voltage, large voltage transition and current transition as in the write operation do not occur. The small amplitude signal readout operation is not affected by the noise due to the write operation, and a stable readout operation can be carried out even in the case where the readout operation and the write operation are independently performed.

In the case where the readout operation and the write operation are simultaneously performed, the timing of transition of the voltage or current in the write operation is delayed, thus eliminating the influence of noise on the readout operation. The readout operation is not delayed and a stable readout operation can be secured at a high speed. Moreover, the delay time in the write operation can be limited to the processing period for the small amplitude signal in the readout operation. The delay time is very short in comparison with the long write time and the overhead of the delay time occupying the write operation time can be neglected.

Figure 19:
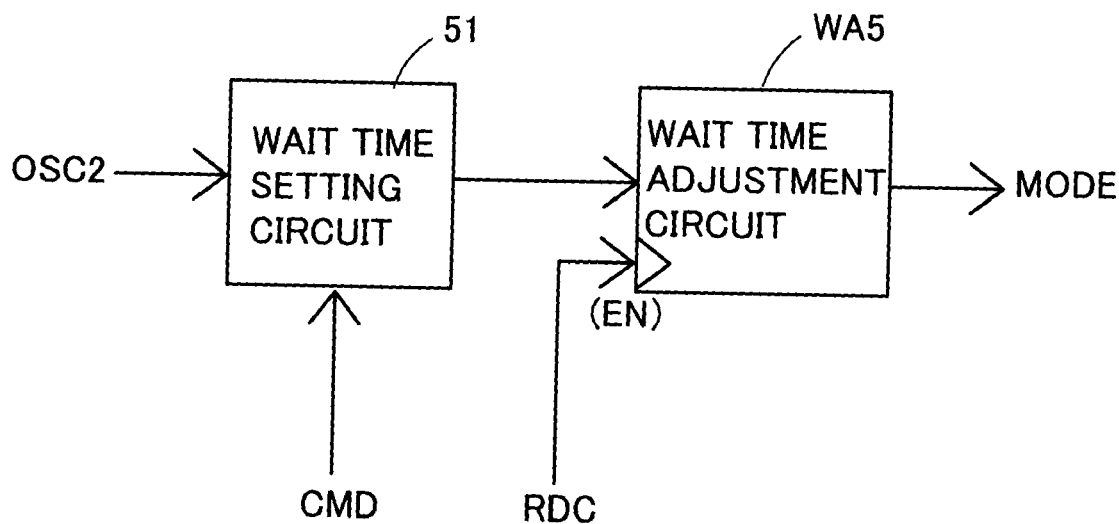
FIG. 19 is a circuit block diagram showing a state machine in a semiconductor memory in a fifth embodiment.
Figure 20:
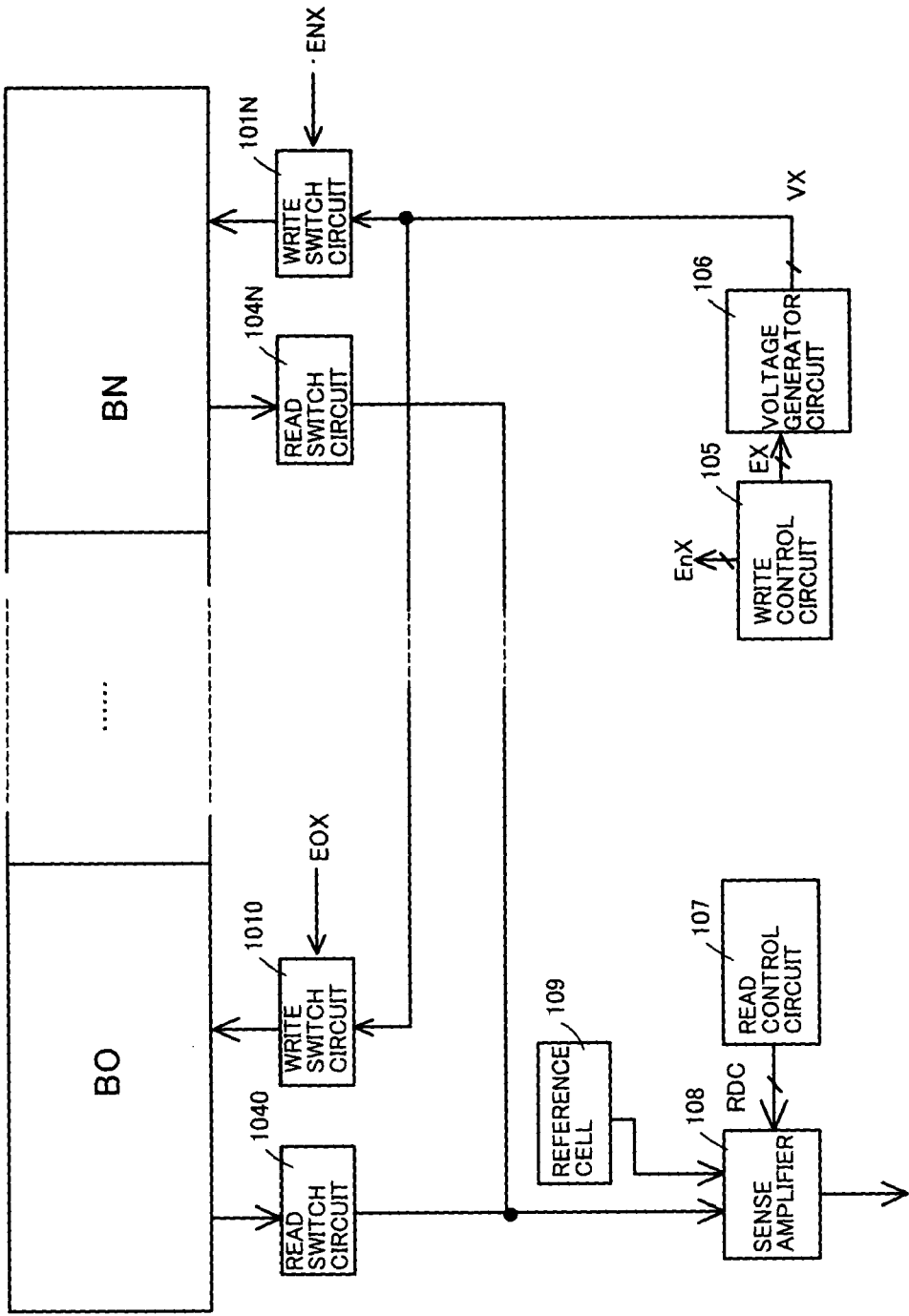
FIG. 20 is a circuit block diagram of a conventional semiconductor memory.

A fifth embodiment shown in FIG. 19 is an embodiment of a state machine for adjusting the state transition timing set by a wait time setting circuit 51 in accordance with the read control signal RDC and then outputting the adjusted state transition timing as the mode signal MODE.

From the wait time setting circuit 51 to which a command signal CMD for setting a mode and the state oscillation signal OSC2 are inputted, a timing signal is outputted. The timing signal is inputted to a wait time adjustment circuit WA5, from which the mode signal MODE is outputted. The read control signal RDC is inputted to an enable terminal (EN) of the wait time adjustment circuit WA5.

The wait time setting circuit 51 outputs the timing signal corresponding to the command signal CMD. The wait time setting circuit 51 sets the output timing of the timing signal by timing the state oscillation signal OSC2 in accordance with predetermined timing.

The wait time adjustment circuit WA5 sets the output timing of the mode signal MODE corresponding to the inputted timing signal in accordance with the read control signal RDC inputted to the enable terminal (EN). That is, when the read control signal RDC is at a low level and the wait time adjustment circuit WA5 is inactive, timing adjustment is not carried out and the timing signal is outputted as it is as the mode signal MODE. When the read control signal RDC is at a high level and the wait time adjustment circuit WA5 is active, timing adjustment is carried out and the mode signal MODE is then outputted. Specifically, a delay is added to the timing signal and the mode signal MODE is outputted.

According to the fifth embodiment, the wait time adjustment circuit WA5 adds a predetermined delay to the inputted timing signal in accordance with the read control signal RDC. As the transition timing of the mode signal MODE is delayed, the state transition can be delayed. By the delay of the mode signal MODE outputted from the state machine, predetermined voltage or current transition in the data write operation can be delayed.

The wait time adjustment circuit WA5 is an example of a preset time adjusting section. The wait time setting circuit 51 is an example of a circuit for setting a predetermined time until state transition or a preset time of a predetermined operation sequence.

At the time of readout, during a period when read-out memory data and reference data are small amplitude signals and the voltage difference between these data when being differentially amplified is a small amplitude voltage, large voltage transition and current transition as in the write operation do not occur. The small amplitude signal readout operation is not affected by the noise due to the write operation, and a stable readout operation can be carried out even in the case where the readout operation and the write operation are independently performed.

In the case where the readout operation and the write operation are simultaneously performed, the timing of transition of the voltage or current in the write operation is delayed, thus eliminating the influence of noise on the readout operation. The readout operation is not delayed and a stable readout operation can be secured at a high speed. Moreover, the delay time in the write operation can be limited to the processing period for the small amplitude signal in the readout operation. The delay time is very short in comparison with the long write time and the overhead of the delay time occupying the write operation time can be neglected.

In the fifth embodiment, the setting of the delay time added by the wait time adjustment circuit WA5 is not particularly described. However, the delay time may be a predetermined fixed time, or a circuit structure enabling rewriting of the delay time from outside may be employed. As the circuit enabling rewriting, plural fuses are provided, and any circuit system enabling rewriting and storage of data can be properly selected such as a system for setting the time in accordance with disconnection/non-disconnection, a system for writing to a register or the like made up of a flip-flop circuit or the like, or a system for writing to a memory device such as a RAM or a flash memory.

The present invention is not limited the above-described embodiments, and various improvements and modifications may be effected without departing from the scope of the present invention.

For example, while a non-volatile memory is used in the embodiments, the present invention is not limited to this and can be similarly applied to a semiconductor memory having plural independently operating operation modes. For example, the present invention can be applied to the case where, for a semiconductor memory having a data input/output operation from/to outside and a refresh operation which is independently carried out internally, timing for carrying out a small amplitude signal operation and timing for carrying out large voltage or current amplification exist in both operations. As an example of this case, the small amplitude signal operation may be considered to be a differential amplification operation of data read out from a memory cell, and the large amplification operation may be considered to be a word line driving operation, a data input/output operation from/to outside and the like.

Although a bias voltage of a positive voltage is described as a boosting voltage in the embodiments, the present invention is not limited to this. In the case where an internal lowering voltage is used as a power source voltage VCC, an external voltage prior to voltage lowering can be used instead of the boosting voltage.

According to the present invention, a control method of a semiconductor memory device which enables control of an operation mode including an operation that might become a noise source by using an operation mode including an operation from which the influence of noise should be eliminated, in a semiconductor memory device having plural independently operating operation modes, and a semiconductor memory device can be provided.

What is claimed is:

1. A control method of a semiconductor memory device comprising the steps of:
   first operation step executed in accordance with first operation sequence;
   second operation step executed in accordance with second operation sequence separately from the first operation step; and
   control step for delaying predetermined state transition to be executed in the second operation step following an instruction of the second operation sequence in accordance with predetermined first operation state in the first operation sequence.

2. A control method of a semiconductor memory device according to claim 1, wherein the predetermined state transition delayed in the control step is at least one of following operation states, namely, start of the second operation step, end of the second operation step, and state change in the second operation step.

3. A control method of a semiconductor memory device according to claim 1, wherein the predetermined first operation state is an operation state due to a small amplitude signal, and the predetermined state transition is either voltage transition or current transition that is a noise source against an operation state caused by the small amplitude signal.

4. A control method of a semiconductor memory device according to claim 1, wherein the control step includes response delay step for delaying a response to an instruction of the predetermined state transition in the second operation sequence based on the predetermined first operation state.

5. A control method of a semiconductor memory device according to claim 4, wherein the second operation step includes at least either one of voltage generate step or current generate step, and due to the response delay step, there is delayed state change of voltage or current such as change from non-output state to output state or change from output state to non-output state in the voltage generate step or the current generate step, respectively.

6. A control method of a semiconductor memory device according to claim 4, wherein the second operation step includes at least either one of voltage generate step or current generate step, and due to the response delay step, there is delayed starting or stopping generation of voltage or current in the voltage generate step or the current generate step, respectively.

7. A control method of a semiconductor memory device according to claim 4, wherein the second operation step include path form step, and due to the response delay step, there is delayed state change of a signal path establishment such as change from not-established to established state or change from established to not-established state in the path form step.

8. A control method of a semiconductor memory device according to claim 1, wherein the second operation step includes state transition instruct step for giving an instruction of state transition for each predetermined time in accordance with the second operation sequence, and timer step for supplying timer information to the state transition instruct step, and the control step includes timer delay step for delaying supply timing of the timer information based on the predetermined first operation state.

9. A control method of a semiconductor memory device according to claim 8, wherein the timer step includes basic timer step for supplying the timer information per unit of basic time, and timer of the basic time in the basic timer step is stopped or delayed due to the time delay step.

10. A control method of a semiconductor memory device according to claim 9, wherein stop of the timer is conducted per unit of the basic time.

11. A control method of a semiconductor memory device according to claim 9, wherein delay of the timer is conducted by time responsive to the predetermined first operation state.

12. A control method of a semiconductor memory device according to claim 1, wherein the second operation step includes state transition instruct step for giving an instruction of state transition for each predetermined time in accordance with the second operation sequence, and the control step includes delay add step for delaying the instruction of the predetermined state transition based on the predetermined first operation state.

13. A control method of a semiconductor memory device according to claim 1, wherein the second operation step includes state transition instruct step for giving an instruction of state transition for each predetermined time in accordance with the second operation sequence, and the control step includes setting time adjust step for expanding the predetermined time in the state transition instruct step based on the predetermined first operation state.

14. A control method of a semiconductor memory device according to claim 1, wherein the semiconductor memory device includes non-volatile memory cells electrically rewritable, as memory cells.

15. A control method of a semiconductor memory device according to claim 14, wherein the first operation step is data readout operation step, and the second operation step is data write operation step.

16. A control method of a semiconductor memory device according to claim 15, wherein the data write operation step is data program step or data erase step.

17. A semiconductor memory device comprising:
   a first circuit that outputs at least one first signal for first operation in accordance with first operation sequence; and
   a second circuit that outputs at least one second signal for second operation executed separately from the fist operation in accordance with second operation sequence,
   wherein the second circuit is controlled by at least one predetermined first signal out of the at least one first signal, and an output of at lest on predetermined second signal out of the at least one second signal is delayed.

18. A semiconductor memory device according to claim 17, wherein the predetermined second signal is a signal outputted with at least one of following timings, namely, start of the second operation, end of the second operation, and operation change due to the second operation sequence.

19. A semiconductor memory device according to claim 17, wherein the predetermined first signal is a signal of small amplitude signal operation in the first operation, and the predetermined second signal is a signal accompanying either voltage transition or current transition that is a noise source against the small amplitude signal operation.

20. A semiconductor memory device according to claim 17, wherein the second circuit includes a sequence controller section for controlling the second operation sequence, a signal output section for outputting the at least one second signal, in accordance with at least one control signal from the sequence controller section, and a response delay section for delaying output response of the at least one predetermined second signal with regard to at least one predetermined control signal among the control signals in the signal output section in accordance with the at least one predetermined first signal.

21. A semiconductor memory device according to claim 20, wherein the signal output section includes a voltage generator circuit or a current generator circuit, and due to the response delay section, there is a delayed state change of voltage or current such as change from non-output state to output state or change from output state to non-output state.

22. A semiconductor memory device according to claim 20, wherein the signal output section includes a voltage generator circuit or a current generator circuit, and due to the response delay section, there is delayed starting or stopping circuit operation of the voltage generator circuit or the current generator circuit.

23. A semiconductor memory device according to claim 20, wherein the signal output section includes a switch circuit, and due to the response delay section, there is delayed open-close change timing of the switch circuit.

24. A semiconductor memory device according to claim 17, wherein the second circuit includes a sequence controller section for controlling the second operation sequence, a timer section for supplying the sequence controller section with timer information, and a timer delay section for delaying a timer operation in the timer section, in accordance with the at least one predetermined first signal.

25. A semiconductor memory device according to claim 24, wherein the timer section includes an oscillator section for outputting an oscillation signal of predetermined cycle, and due to the timer delay section, there is executed stopping of an oscillation operation or cycle expanding of the oscillation signal.

26. A semiconductor memory device according to claim 25, wherein stopping of the oscillation operation is inhibition of signal transition in the oscillation signal.

27. A semiconductor memory device according to claim 25, wherein cycle expanding of the oscillation signal is time expanding responsive to activation time of the at least one predetermined first signal.

28. A semiconductor memory device according to claim 17, wherein the second circuit includes a sequence controller section for controlling the second operation sequence, and a delay adder section for delaying at least one predetermined control signal outputted from the sequence controller section, in accordance with the at least one predetermined first signal.

29. A semiconductor memory device according to claim 17, wherein the second circuit includes a sequence controller section for controlling the second operation sequence, and a setting time adjustor section for expanding setting time of predetermined operation sequence in the second operation sequence, in accordance with the at least one predetermined first signal.

30. A semiconductor memory device according to claim 17 further comprising electronically rewritable non-volatile memory cells as memory cells.

31. A semiconductor memory device according to claim 30, wherein the first operation is data readout operation, and the second operation is data write operation.

32. A semiconductor memory device according to claim 31, wherein the data write operation is data program operation or data erase operation.

* * * * *